(12) United States Patent
Aoki et al.

(10) Patent No.: US 6,844,998 B2
(45) Date of Patent: Jan. 18, 2005

(54) MAGNETORESISTIVE SENSOR CAPABLE OF NARROWING GAP AND TRACK WIDTH

(75) Inventors: Daigo Aoki, Niigata-ken (JP); Kenji Honda, Niigata-ken (JP); Kiyoshi Sato, Niigata-ken (JP); Naoya Hasegawa, Niigata-ken (JP); Yukie Nakazawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 91 days.

(21) Appl. No.: 10/103,359

(22) Filed: Mar. 20, 2002

(65) Prior Publication Data

US 2002/0135947 A1 Sep. 26, 2002

(30) Foreign Application Priority Data

Mar. 22, 2001  (JP) ........................................ 2001-083129

(51) Int. Cl.[7] ................................................. G11B 5/39
(52) U.S. Cl. ...................................................... 360/322
(58) Field of Search ................................. 360/322, 313, 360/314, 315, 319, 320, 327.3, 327.31

(56) References Cited

U.S. PATENT DOCUMENTS

| | | | |
|---|---|---|---|
| 5,633,771 A | | 5/1997 | Yoda et al. |
| 5,828,532 A | * | 10/1998 | Ahlert et al. ............... 360/322 |
| 5,926,348 A | * | 7/1999 | Shouji et al. ............... 360/327 |
| 6,056,996 A | | 5/2000 | Yoda et al. |
| 6,115,216 A | | 9/2000 | Yoda et al. |
| 6,434,814 B1 | * | 8/2002 | Chang et al. ............. 29/603.14 |
| 6,445,553 B2 | * | 9/2002 | Barr et al. ................... 360/320 |
| 6,483,672 B1 | * | 11/2002 | Arnett et al. ............... 360/313 |
| 6,493,194 B1 | * | 12/2002 | Sakaguchi et al. .......... 360/322 |
| 6,714,387 B1 | * | 3/2004 | Horng et al. ............... 360/320 |

FOREIGN PATENT DOCUMENTS

JP          2000099927         * 4/2000

OTHER PUBLICATIONS

Webster's II, New College Dictionary, 1995, p. 782.*

* cited by examiner

Primary Examiner—A. J. Heinz
Assistant Examiner—Angel A. Castro
(74) Attorney, Agent, or Firm—Brinks Hofer Gilson & Lione

(57) ABSTRACT

Assuming that a distance between an upper shield layer and a lower shield layer in an area, which overlaps only a first electrode layer, but does not overlap a second electrode layer, is G1s, and a distance between the upper shield layer and the lower shield layer at a position in alignment with a center of a multilayered film is G1c, a difference in value between G1s and G1c is set to be not larger than a predetermined value, whereby an effective track (read) width can be reduced.

13 Claims, 24 Drawing Sheets

FIG. 28
PRIOR ART
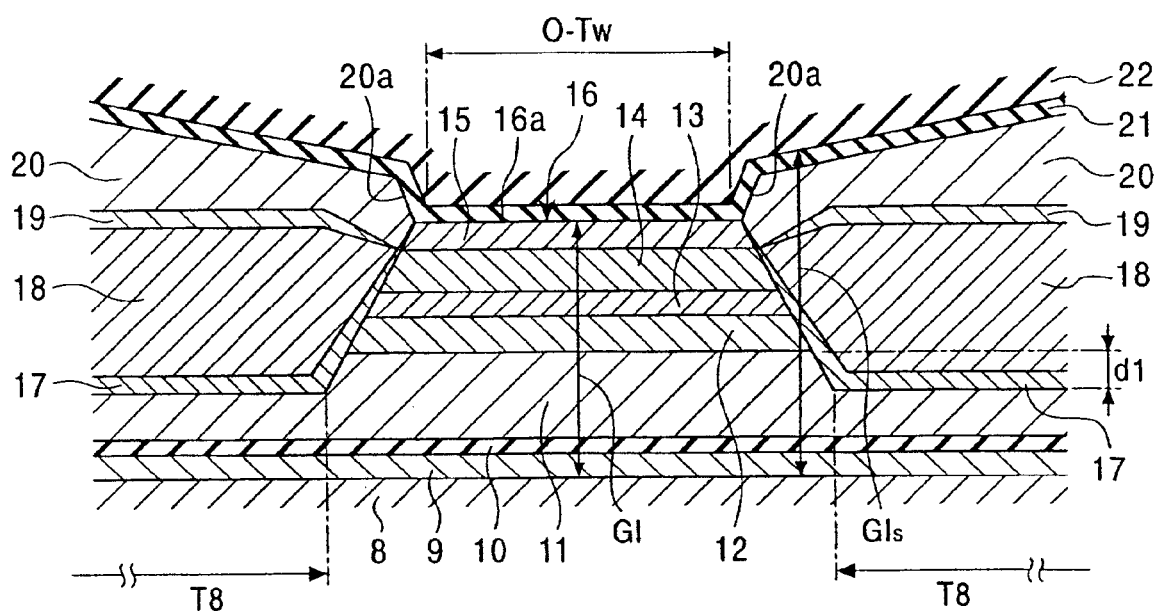
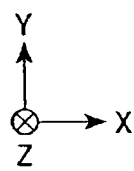

US 6,844,998 B2

MAGNETORESISTIVE SENSOR CAPABLE OF NARROWING GAP AND TRACK WIDTH

BACKGROUND OF THE INVENTION

1. Field of the Invention

The present invention relates to a magnetoresistive sensor for detecting a magnetic field by utilizing the magnetoresistance effect. More particularly, the present invention relates to a magnetoresistive sensor that is capable of narrowing an effective track (read) width and is adaptable for higher recording density, and to a method for manufacturing the magnetoresistive sensor.

2. Description of the Related Art

FIG. 28 is a sectional view of a conventional magnetoresistive sensor, looking from the side facing a recording medium.

In the magnetoresistive sensor shown in FIG. 28, a lower gap layer 9 is formed on a lower shield layer 8, and an antiferromagnetic layer 11 is formed on the lower gap layer 9 to extend in the X-direction (as shown in the figure), with an underlying layer 10 interposed between the two layers 11 and 9. The antiferromagnetic layer 11 is projected upwardly at a height d1 along its central area (as viewed in the X-direction). A pinned magnetic layer 12, a nonmagnetic electrically conductive layer 13, a free magnetic layer 14, and a protective barrier layer 15 are successively formed in that order on the projected area of the antiferromagnetic layer 11. As a result, a multilayered film 16 is formed by the stack from the underlying layer 10 to the protective barrier layer 15.

The antiferromagnetic layer 11 is formed of an antiferromagnetic material, such as a Pt—Mn (platinum-manganese) alloy. The pinned magnetic layer 12 and the free magnetic layer 14 are each formed of, e.g., a Ni—Fe (nickel-iron) alloy, Co (cobalt), a Co—Fe (cobalt-iron) alloy, or a Co—Fe—Ni alloy. The nonmagnetic electrically conductive layer 13 is formed of a nonmagnetic electrically conductive material having low electrical resistance, such as Cu (copper).

As shown in FIG. 28, metal films 17, each of which is formed of, e.g., Cr, and which serve as a buffer film and an alignment film, are formed on areas indicated by a width T8 of the antiferromagnetic layer 11 extending in the X-direction such that the metal films 17 cover respective opposite lateral surfaces of the pinned magnetic layer 12, the nonmagnetic electrically conductive layer 13 and the free magnetic layer 14. The formation of the metal films 17 help to increase the bias magnetic field generated by hard bias layers 18 (described below).

The hard bias layers 18 of, for example, a Co—Pt (cobalt-platinum) alloy or a Co—Cr—Pt (cobalt-chromium-platinum) alloy, are formed on the metal films 17.

The hard bias layers 18 are magnetized in the X-direction (track-width direction). With the bias magnetic field generated by the hard bias layers 18 in the X-direction, magnetization of the free magnetic layer 14 is aligned in the X-direction.

Also, intermediate layers 19 of a nonmagnetic material, such as Ta, are formed on the hard bias layers 18, and electrode layers 20 of, for example, Cr, Au, Ta or W, are formed on the intermediate layers 19.

Further, an upper gap layer 21 of an insulating material is formed on both the multilayered film 16 and the electrode layers 20, and an upper shield layer 22 of a magnetic material is formed on the upper gap layer 21.

In the above-mentioned structure, the width of an upper surface of the multilayered film 16 on which the electrode layer 20 is not formed defines an optical track width O-Tw, and the distance between the upper shield layer 22 and the lower shield layer 8 at a position which is aligned with the center of the multilayered film 16 defines a gap length G1.

With the recent progress toward higher recording densities of magnetic recording mediums, the demand for further reducing the gap length G1 of magnetoresistive sensors has increased for the purpose of increasing linear recording density. To reduce the gap length G1, the film thicknesses of the lower gap layer 9 and the upper gap layer 21 must be decreased.

In the structure of the conventional magnetoresistive sensor shown in FIG. 28, however, the surface on which the upper gap layer 21 is formed includes a step (level difference) formed by a lateral surface 20a of the electrode layer 20a relative to a surface 16a of the multilayered film 16. The insulating material used for forming the upper gap layer 21 is difficult to deposit on such a step. Accordingly, as the film thickness of the upper gap layer 21 is reduced, and while the step remains formed as described above, the upper gap layer 21 becomes more difficult to deposit on the step, and the risk of a short-circuit is more likely to occur between the upper shield layer 22 and the electrode layer 20.

As another problem, there occurs a phenomenon that magnetic fields generated from recording tracks of a recording medium, which are positioned on both sides of a recording track under detection, enter the magnetoresistive sensor and are detected in areas near opposite ends of the multilayered film 16. Such a phenomenon is negligible when the track width of the magnetoresistive sensor and the track pitch are relatively wide, e.g., when the track width is not less than 0.2 $\mu$m. At a track width of less than 0.2 $\mu$m, however, the track pitch is narrowed correspondingly and a ratio of the magnitude of magnetic fields entering from the recording tracks on both sides to the magnitude of magnetic field generated by the recording track under detection is increased. This leads to a phenomenon that the effective track width is larger than the optical track width O-Tw, and hence, the magnetoresistive sensor is not adaptable for higher recording density of a recording medium.

SUMMARY OF THE INVENTION

With the view of overcoming the problems set forth above, it is an object of the present invention to provide a magnetoresistive sensor capable of narrowing a gap and a track width, and to provide a method for manufacturing the magnetoresistive sensor.

The present invention provides a magnetoresistive sensor including, on a substrate, a lower shield layer made of a magnetic material; a lower gap layer made of an insulating material and formed on the lower shield layer; a multilayered film formed on the lower gap layer; an electrode portion for supplying an electric current to the multilayered film; an upper gap layer made of an insulating material and formed on the multilayered film and the electrode portion; and an upper shield layer made of a magnetic material and formed on the upper gap layer. The multilayered film is made up of an antiferromagnetic layer, a pinned magnetic layer having a magnetized direction pinned by an exchange coupling magnetic field produced upon interaction with the antiferromagnetic layer, a nonmagnetic material layer, and a free magnetic layer of which magnetization is varied depending on an external magnetic field. The electrode portion comprises a plurality of electrode layers successively formed as plural pairs of electrodes in an area overlapping the multilayered film and/or areas on both sides of the multilayered film such that each pair of electrodes are spaced from each other by a predetermined spacing in a track-width direction, and the spacing between each pair of electrodes in the track-width direction is larger in the electrode layer located at a higher level. Wherein, assuming that a distance between the upper shield layer and the lower shield layer in an area which overlaps only a lowermost one of the plurality of electrode layers is G1$s$, and a distance between the upper shield layer and the lower shield layer at a position in alignment with a center of the multilayered film is G1$c$, a difference in value between G1$s$ and G1$c$ is set to be not larger than a predetermined value such that an effective track width of the magnetoresistive sensor has a value equal to 0.17 µm or below.

Since the lowermost layer is disposed on both sides of the multilayered film in an adjacent relation, the distance G1$s$ between the upper shield layer and the lower shield layer in the area which overlaps only the lowermost layer refers to the distance between the upper shield layer and the lower shield layer near the multilayered film on both sides thereof.

If the distance between the upper shield layer and the lower shield layer near the multilayered film on both sides thereof is increased, magnetic fields generated from recording tracks of a recording medium on both sides of a recording track under detection are more likely to enter the magnetoresistive sensor through spacing between the upper shield layer and the lower shield layer, resulting in an increased effective track width. In other words, crosstalk between adjacent recording tracks is more apt to occur.

In fact, and as will be described later, as the difference in value between G1$s$ and G1$c$ increases, the effective track width of the magnetoresistive sensor is also increased.

In the present invention, by setting the difference in value between G1$s$ and G1$c$ to be not larger than the predetermined value, it is possible to suppress an increase in the distance between the upper shield layer and the lower shield layer near the multilayered film on both sides thereof, and hence to reduce the effective track width. In the present invention, the effective track width can be reduced to 0.17 µm or below.

When reducing the distance between the upper shield layer and the lower shield layer in the vicinity of the multilayered film on both sides thereof, however, there occurs a need for reducing the film thickness of the electrode layer formed on both sides of the multilayered film and which supplies a direct current to the multilayered film. That need increases the direct-current resistance value of the magnetoresistive sensor.

In the present invention, the electrode portion comprises a plurality of electrode layers successively formed as plural pairs of electrodes such that each pair of electrodes are spaced from each other by a predetermined spacing in a track-width direction, and the spacing between each pair of electrodes in the track-width direction is larger in the electrode layer located at a higher level. With that structure, the electrode portion is formed as a thin single layer near the multilayered film, and the film thickness of the electrode portion in an area away from the multilayered film is increased by forming a plurality of electrode layers.

Consequently, the direct-current resistance value of the magnetoresistive sensor can be reduced while reducing the distance between the upper shield layer and the lower shield layer near the multilayered film on both sides thereof.

Also, since the electrode portion is formed as a thin layer near the multilayered film, the step (level difference) formed by a lateral slope of the electrode portion relative to a surface of the multilayered film can be reduced. Therefore, even when the film thickness of the upper gap layer is reduced, the upper gap layer can be adequately formed on the step. An electrical short-circuit between the upper shield layer and the electrode portion can therefore be prevented with high reliability.

Also, the present invention provides a magnetoresistive sensor including, on a substrate, a lower shield layer made of a magnetic material; a lower gap layer made of an insulating material and formed on the lower shield layer; a multilayered film formed on the lower gap layer; an electrode portion for supplying an electric current to the multilayered film; an upper gap layer made of an insulating material and formed on the multilayered film and the electrode portion; and an upper shield layer made of a magnetic material and formed on the upper gap layer. The multilayered film is made up of an antiferromagnetic layer, a pinned magnetic layer having a magnetized direction pinned by an exchange coupling magnetic field produced upon interaction with the antiferromagnetic layer, a nonmagnetic material layer, and a free magnetic layer of which magnetization is varied depending on an external magnetic field. The electrode portion comprises a plurality of electrode layers successively formed as plural pairs of electrodes in an area overlapping the multilayered film and/or areas on both sides of the multilayered film such that each pair of electrodes are spaced from each other by a predetermined spacing in a track-width direction, and the spacing between each pair of electrodes in the track-width direction is larger in the electrode layer located at a higher level.

The magnetoresistive sensor further includes an insulating layer covering a part of a lowermost one of the plurality of electrode layers and all of one or more electrode layers other than the lowermost. Wherein, assuming that the distance between the upper shield layer and the lower shield layer in an area which overlaps only the lowermost one of the plurality of electrode layers, but does not overlap the insulating layer, is G1$s$, and the distance between the upper shield layer and the lower shield layer at a position in alignment with a center of the multilayered film is G1$c$, a difference in value between G1$s$ and G1$c$ is set to be not larger than a predetermined value such that an effective track width of the magnetoresistive sensor has a value equal to 0.17 µm or below.

With the above features of the present invention, since an insulating layer is formed to cover a part of a lowermost one of the plurality of electrode layers and all of one or more electrode layers other than the lowermost one, an electrical short-circuit between the upper shield layer and the electrode portion can be more surely prevented in such areas not affecting the effective track width and the reproduced pulse width (PW50).

Values of G1$s$ and G1$c$ are preferably set to satisfy a range of G1$c$−20 nm≦G1$s$≦G1$c$+90 nm. More preferably, values of G1$s$ and G1$c$ are set to satisfy a range of G1$c$−20 nm≦G1$s$≦G1$c$+70 nm. Even more preferably, values of G1$s$ and G1$c$ are set to satisfy a range of G1$c$−20 nm≦G1$s$ ≦G1$c$+30 nm.

Stated otherwise, values of G1$s$ and G1$c$ are preferably set to satisfy a range of 0.67≦G1$s$/G1$c$≦2.50. More preferably, values of G1$s$ and G1$c$ are set to satisfy a range of 0.67≦G1$s$/G1$c$≦2.17. Even more preferably, values of G1$s$ and G1$c$ are set to satisfy a range of 0.67≦G1$s$/G1$c$≦1.50.

Furthermore, values of G1$s$ and G1$c$ may be set to satisfy a relationship of G1$s$>G1$c$, G1$s$=G1$c$, or G1$s$<G1$c$ so long as the values of G1s and G1c satisfy any of the above-mentioned ranges.

When the relationship G1s >G1c is satisfied, the distance between the upper shield layer and the lower shield layer near the multilayered film on both sides thereof is larger than the distance (gap length) between the upper shield layer and the lower shield layer in the area overlying the multilayered film.

When the relationship G1s=G1c is satisfied, the distance between the upper shield layer and the lower shield layer near the multilayered film on both sides thereof is equal to the distance (gap length) between the upper shield layer and the lower shield layer in the area overlying the multilayered film.

When the relationship G1s<G1c is satisfied, the distance between the upper shield layer and the lower shield layer near the multilayered film on both sides thereof is smaller than the distance (gap length) between the upper shield layer and the lower shield layer in the area overlying the multi-layered film.

Furthermore, the present invention provides a magnetoresistive sensor including, on a substrate, a lower shield layer made of a magnetic material; a lower gap layer made of an insulating material and formed on the lower shield layer; a multilayered film formed on the lower gap layer; a hard bias layer for aligning a magnetized direction of the free magnetic layer in a certain direction; an electrode portion formed at a position overlying the hard bias layer and supplying an electric current to the multilayered film; an upper gap layer made of an insulating material and formed on the multilayered film and the electrode portion; and an upper shield layer made of a magnetic material and formed on the upper gap layer. The multilayered film is made up of an antiferromagnetic layer, a pinned magnetic layer having a magnetized direction pinned by an exchange coupling magnetic field produced upon interaction with the antiferromagnetic layer, a nonmagnetic material layer, and a free magnetic layer of which magnetization is varied depending on an external magnetic field. The electrode portion comprises a plurality of electrode layers successively formed as plural pairs of electrodes in an area overlapping the multilayered film and/or areas on both sides of the multilayered film such that each pair of electrodes are spaced from each other by a predetermined spacing in a track-width direction and the spacing between each pair of electrodes in the track-width direction is larger in the electrode layer located at a higher level.

In the above features of the present invention, the free magnetic layer is put into a single domain state by using a hard bias layer made of a ferromagnetic material that has a high capability of aligning a magnetized direction of the free magnetic layer in a certain direction.

Using a hard bias layer, however, raises the need for forming the electrode portion at a position overlying the hard bias layer. Such a need increases the step (level difference) formed by a lateral slope of the electrode portion relative to a surface of the multilayered film. It is therefore harder to form the upper gap layer on the step with reliability.

In the present invention, the electrode portion preferably comprises a plurality of electrode layers successively formed as plural pairs of electrodes such that each pair of electrodes are spaced apart from each other by a predetermined spacing in a track-width direction, and the spacing between each pair of electrodes in the track-width direction is larger in the electrode layer located at a higher level. With this structure, the electrode portion is formed as a thin single layer near the multilayered film, and the film thickness of the electrode portion in an area away from the multilayered film is increased by forming the plurality of electrode layers.

Consequently, in the present invention, since the electrode portion is formed as a thin layer near the multilayered film, the step formed by the lateral slope of the electrode portion (i.e., between the surface of the multilayered film and the upper surface of the electrode portion), can be reduced, and the upper gap layer can be adequately formed on the step. An electrical short-circuit between the upper shield layer and the electrode portion can therefore be prevented with high reliability.

Preferably, the hard bias layer has a lateral surface on the side facing the multilayered film, which is in direct contact with a lateral surface of the free magnetic layer, or is positioned in an opposite relation to a lateral surface of the free magnetic layer with a bias underlying layer interposed therebetween. The bias underlying layer is made of a non-magnetic material and has a film thickness of not larger than 1 nm. A hard bias layer and a free magnetic layer having these features form a magnetically continuous body, thus resulting in increased stability.

Also, the plurality of electrode layers are preferably formed such that an angle formed between a plane parallel to a surface of the multilayered film and a plane tangential to a front edge of each electrode layer is smaller in the electrode layer located at a higher level, and that an electrode layer located at a higher level has a larger film thickness.

Further, a lowermost one of the plurality of electrode layers preferably has a length in a height direction larger than a length of the multilayered film in the height direction. This permits the direct-current resistance value of the magnetoresistive sensor to be reduced.

Moreover, a lowermost one of the plurality of electrode layers, which is electrically connected to the multilayered film, is preferably formed of one or more elements selected from the group consisting of W, Ta, Rh, Ir and Ru. This insures that smear is less likely to occur in the step of polishing the surface of the magnetoresistive sensor positioned to face a recording medium to adjust the direct-current resistance value. Any electrode layer other than the lowermost one is formed of one or more elements selected from the group consisting of Cr, Cu, Au and Ta.

The effective track width is measured by, e.g., the full-track profile method. The full-track profile method will be described below with reference to FIG. 27.

A signal is recorded on a recording medium in the form of a recording track with a recording track width Ww larger than the device width of a magnetoresistive sensor R. Then, the relationship between a position of the magnetoresistive sensor in the width direction (X-direction) of the recording track and a reproduced output is measured by scanning the magnetoresistive sensor over the recording track in the track-width direction (X-direction). A measured result is shown on the upper side of FIG. 27.

As seen from the reproduced waveform obtained as the measured result, a level of the reproduced output is increased near the center of the recording track, and is reduced as the sensor position is farther away from the center of the recording track.

Points Pc and Pd are defined respectively by intersections at which the X-axis intersects lines tangential to points Pa and Pb where the reproduced output is 50% of a maximum value in the reproduced waveform. A difference between a distance A from the point Pc to Pd and a distance (half-value width) B from the point Pa to Pb defines the effective track (read) width of the magnetoresistive sensor. Herein, the unit of the X-axis is normalized such that the half-value width B=recording track width Ww is obtained.

A method for manufacturing a magnetoresistive sensor, according to the present invention, comprises the steps of:

(a) forming, on a substrate, a lower shield layer, a lower gap layer, and a multilayered film capable of developing a magnetoresistive effect, (b) forming a resist layer on the multilayered film, (c) etching an area of the multilayered film, which is not covered with the resist layer, (d) forming, at a predetermined angle with respect to a direction normal to the substrate, a first electrode layer as a pair of electrodes in an area overlapping the multilayered film and/or areas on both sides of the multilayered film such that the pair of electrodes are spaced from each other by a predetermined spacing in a track-width direction, and then removing the resist layer, (e) forming a lift-off resist layer, which is provided with undercuts, on the multilayered film and the first electrode layer, (f) forming a second electrode layer on the first electrode layer at a predetermined angle with respect to a direction normal to the substrate, (g) removing the lift-off resist layer, (h) forming an upper gap layer on the multilayered film and the second electrode layer, and (i) forming an upper shield layer on the upper gap layer.

Preferably, the predetermined angle in the step (f) is set to be larger than the predetermined angle in the step (d), and the second electrode layer is formed in the step (f) with a film thickness larger than that of the first electrode layer.

The manufacturing method may further comprise the step (j) of forming a lift-off resist layer, which is provided with undercuts, to extend from the multilayered film over an uppermost one of a plurality of electrode layers having been already formed, forming an other electrode layer on the uppermost electrode layer at a predetermined film-forming angle with respect to the direction normal to the substrate, and then removing the resist layer, the step (j) being executed one or more times between the step (g) and (h).

In the step (j), the film-forming angle at which the other electrode layer is formed is preferably set to be larger than the film-forming angle at which the electrode layer positioned under the other electrode layer is formed, and the other electrode layer is formed with a film thickness larger than that of the electrode layer positioned under the other electrode layer.

The manufacturing method preferably further comprises the step (k) of forming an insulating layer to cover upper surfaces of all electrode layers other than the lowermost one, the step (k) being executed between the step (f) and (g), between the step (g) and (h), or between the step (j) and (h).

Further, the manufacturing method preferably comprises the step (l) of forming a lift-off resist layer, which is provided with undercuts, in an area overlying the multilayered film and a part of the lowermost one of the plurality of formed electrode layers, and forming an insulating layer on the upper gap layer in an oblique direction with respect to the substrate so as to cover all the area of the one or more electrode layers other than the lowermost one, the step (l) being executed between the step (h) and (i).

In the magnetoresistive sensor obtained by the manufacturing method of the present invention including the step (k) and/or (l), since the insulating layer is formed to cover all the area of the one or more electrode layers other than the lowermost one, an electrical short-circuit between the upper shield layer and the electrode layers can be more surely prevented in those areas not affecting the effective track width and the reproduced pulse width (PW50).

In the manufacturing method of the present invention, after the step (c), a hard bias layer may be formed on both sides of the multilayered film, and thereafter the first electrode layer may be formed on the hard bias layer in the step (d).

In the step (d), the first electrode layer is preferably formed with a length in a height direction larger than a length of the multilayered film in the height direction.

Also, the first electrode layer is preferably formed of one or more elements selected from the group consisting of W, Ta, Rh, Ir and Ru in the step (d), and any electrode layer other than the first electrode layer is formed of one or more elements selected from the group consisting of Cr, Cu, Au and Ta in the steps (f) and (j).

In the method for manufacturing the magnetoresistive sensor according to the present invention, assuming that the distance between the upper shield layer and the lower shield layer in an area which overlaps only the lowermost one of the plurality of electrode layers, or in an area which overlaps only the lowermost one of the plurality of electrode layers, but does not overlap the insulating layer, is G1s, and the distance between the upper shield layer and the lower shield layer at a position in alignment with a center of the multilayered film is G1c, a difference in the value between G1s and G1c is preferably set to be not larger than a predetermined value such that an effective track width of the magnetoresistive sensor has a value equal to or below 0.17 $\mu$m.

More specifically, the values of G1s and G1c may be set to satisfy a range of G1c−20 nm≦G1s≦G1c+90 nm. Alternatively, Alternatively, the values of G1s and G1c may be set to satisfy a range of 0.67≦G1s/G1c≦2.50.

Furthermore, the values of G1s and G1c may be set to satisfy a relationship of G1s>G1c, G1s=G1c, or G1s<G1c so long as the values of G1s and G1c satisfy any of the above-mentioned ranges.

BRIEF DESCRIPTION OF THE DRAWINGS

FIG. 28 is a sectional view of a conventional magnetoresistive sensor, looking from the side facing a recording medium.

DESCRIPTION OF THE PREFERRED EMBODIMENTS

Figure 1:
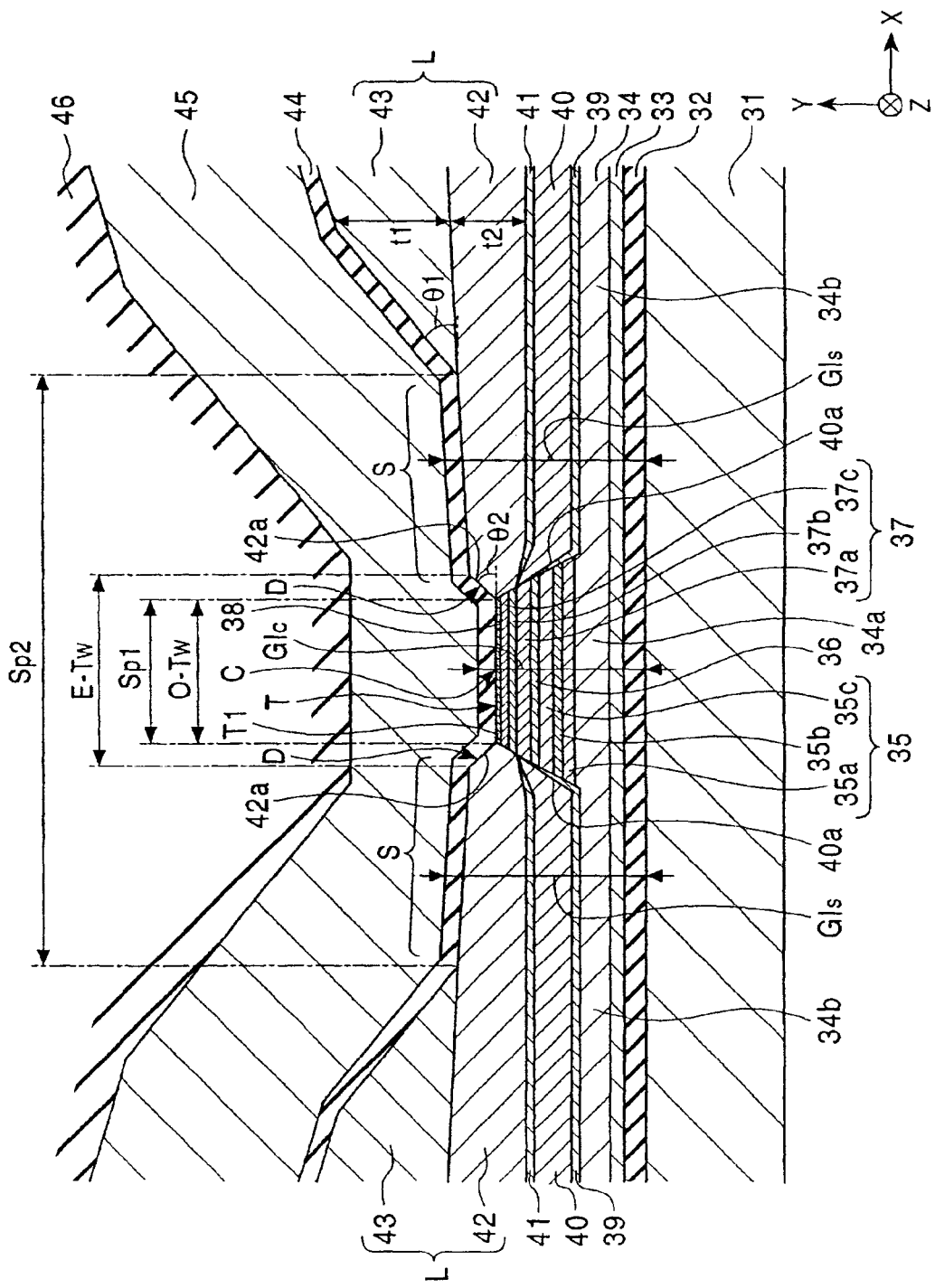
FIG. 1 is a sectional view of a magnetoresistive sensor according to a first embodiment of the present invention, looking from the side facing a recording medium.

FIG. 1 is a sectional view of a magnetoresistive sensor according to a first embodiment of the present invention, looking from the side facing a recording medium.

In FIG. 1, a multilayered film T is constituted by successively forming an underlying layer 33, an antiferromagnetic layer 34, a synthetic ferri-pinned type pinned magnetic layer 35 made up of a first pinned magnetic layer 35a, a nonmagnetic intermediate layer 35b and a second pinned magnetic layer 35c, a nonmagnetic material layer 36, a synthetic ferri-free type free magnetic layer 37 made up of a second free magnetic layer 37a, a nonmagnetic intermediate layer 37b and a first free magnetic layer 37c, and a protective barrier layer 38 in that order.

Under the multilayered film T, a lower shield layer 31 and a lower gap layer 32 are successively formed on a substrate (not shown) through an underlying layer (not shown) of an insulating material, such as alumina.

The antiferromagnetic layer 34 of the multilayered film T is extended in the X-direction. Bias underlying layers 39 of Cr, Ti, Mo or $W_{50}Mo_{50}$, for example, are formed so as to cover, in a contact relation, upper surfaces of oppositely extended areas 34b of the antiferromagnetic layer 34, opposite lateral surfaces of the pinned magnetic layer 35, opposite lateral surfaces of the nonmagnetic material layer 36, and opposite lateral surfaces of the second free magnetic layer 37a. Hard bias layers 40 of a Co—Pt (cobalt-platinum) alloy or a Co—Cr—Pt (cobalt-chromium-platinum) alloy, for example, are formed on the bias underlying layers 39.

Intermediate layers 41 of a nonmagnetic material, such as Ta, are formed on the hard bias layers 40, and first electrode layers 42 made of at least one or more of the elements Cr, Au, Ta, W, Rh, Ir and Ru, for example, are formed on the intermediate layers 41.

The first electrode layers 42, 42 are constituted as a pair of electrodes formed in areas on both sides of the multilayered film T with a predetermined spacing Sp1 therebetween in the track-width direction. Second electrode layers 43, 43 of Cr, Au, Cu or Ta, for example, are formed on the first electrode layers 42, 42. The second electrode layers 43, 43 constitute a pair of electrodes having a spacing Sp2 therebetween in the track-width direction, which is set to be larger than the spacing Sp1 between the first electrode layers 42, 42.

An upper gap layer 44 is formed on a surface of the multilayered film T, surfaces of the first electrode layers 42, 42, and surfaces of the second electrode layers 43, 43. An upper shield layer 45 is formed on the upper gap layer 44. The upper shield layer 45 is covered with a protective barrier layer 46 of an inorganic insulating material. As an alternative, an inductive head for recording may be formed on the upper shield layer 45.

The lower shield layer 31, the lower gap layer 32, the underlying layer 33, the antiferromagnetic layer 34, the pinned magnetic layer 35, the nonmagnetic material layer 36, the free magnetic layer 37, the protective barrier layer 38, the bias underlying layer 39, the hard bias layer 40, the intermediate layer 41, the first electrode layer 42, the second electrode layer 43, the upper gap layer 44, the upper shield layer 45, and the protective barrier layer 46 are formed by any suitable thin-film forming process, such as sputtering and vapor deposition.

The lower shield layer 31 and the upper shield layer 45 are each formed using a magnetic material, such as NiFe. The lower shield layer 31 and the upper shield layer 45 are preferably formed such that their easily magnetizable axes are aligned in the track-width direction (the X-direction as shown in the figure). Additionally, the lower shield layer 31 and the upper shield layer 45 may be formed by electrolyte plating.

The lower gap layer 32, the upper gap layer 44 and the protective barrier layer 46 are each formed of a nonmagnetic inorganic material, such as $Al_2O_3$ or $SiO_2$.

The underlying layer 33 is formed using, e.g., Ta.

The antiferromagnetic layer 34 is formed of a PtMn alloy, an X—Mn alloy (where X represents one or more elements selected from the group consisting of Pd, Ir, Rh, Ru, Os, Ni and Fe), or a Pt—Mn—X' alloy (where X' represents one or more elements selected from the group consisting of Pd, Ir, Rh, Ru, Au, Ag, Os, Cr, Ni, Ar, Ne, Xe and Kr).

The above alloys have an irregular face centered cubic (fcc) structure in a state immediately after formation of an alloy film, but may be transformed into a CuAuI-type regular face centered tetragonal (fct) structure through heat treatment.

The antiferromagnetic layer 34 has a film thickness in the range of 80–300 Å (e.g., 200 Å) near the center in the track-width direction.

In the PtMn alloy and the alloy denoted by the formula X—Mn, which are used for forming the antiferromagnetic layer 34, Pt or X is preferably in the range of 37–63 at %, and more preferably in the range of 47–57 at %. It should be noted that unless expressly specified otherwise, upper and lower limits of the numerical range denoted by using a mark "–" represent respectively values that are equal to or between the indicated numerals.

In the alloy denoted by the formula Pt—Mn—X', X'+Pt is preferably in the range of 37–63 at %, and is more preferably in the range of 47–57 at %. Further, in the alloy denoted by the formula Pt—Mn—X', X' is preferably in the range of 0.2–10 at %. Additionally, when X' is one or more elements selected from the group consisting of Pd, Ir, Rh, Ru, Os, Ni and Fe, X' is preferably in the range of 0.2–40 at %.

An antiferromagnetic layer 34 generating a strong exchange coupling magnetic field can be obtained by using and heat-treating any of the above-mentioned alloys. In particular, using the PtMn alloy enables the antiferromagnetic layer 34 to have superior characteristics in that the exchange coupling magnetic field is not less than 48 kA/m (e.g., in excess of 64 kA/m), and the blocking temperature at which the exchange coupling magnetic field disappears is as high as 380° C.

The first pinned magnetic layer 35a and the second pinned magnetic layer 35c are each formed of a ferromagnetic material, such as a NiFe alloy, Co, a CoFeNi alloy, a CoFe alloy or a CoNi alloy. Of these materials, the CoFe alloy or Co is preferably used. Also, the first pinned magnetic layer 35a and the second pinned magnetic layer 35c are preferably formed of the same material.

The nonmagnetic intermediate layer 35b is formed of a nonmagnetic material, e.g., one selected from the group consisting of Ru, Rh, Ir, Cr, Re and Cu, or an alloy of two or more selected therefrom. Of these materials, Ru is preferably used.

The nonmagnetic material layer 36 functions to prevent magnetic coupling between the pinned magnetic layer 35 and the free magnetic layer 37, and allows a sensing electric current to flow primarily through it. The nonmagnetic material layer 36 is formed of a nonmagnetic material having conductivity, such as Cu, Cr, Au or Ag. Of these materials, Cu is preferably used.

The first free magnetic layer 37c and the second free magnetic layer 37a are each formed of a ferromagnetic material, such as a NiFe alloy, Co, a CoFeNi alloy, a CoFe alloy or a CoNi alloy. Of these materials, the NiFe alloy, the CoFe alloy or the CoFeNi alloy is preferably used.

The nonmagnetic intermediate layer 37b is formed of a nonmagnetic material, e.g., one selected from the group consisting of Ru, Rh, Ir, Cr, Re and Cu, or an alloy of two or more selected therefrom. Of these materials, Ru is preferably used.

The protective barrier layer 38 is formed of, e.g., Ta.

The bias underlying layer 39 is preferably formed using, for example, Cr, Ti, Mo or $W_{50}Mo_{50}$, which have a bcc (body-centered cubic) crystal structure. This is because the use of such a material increases the coercive force and the remanence ratio of the hard bias layer 40, and therefore contributes to an increase in the bias magnetic field.

A lateral surface 40a of each of the hard bias layers 40 positioned to face the multilayered film T is extended to contact only the lateral surface of the pinned magnetic layer 35, the lateral surface of the nonmagnetic material layer 36 and the lateral surface of the second free magnetic layer 37a, but not to contact the lateral surface of the first free magnetic layer 37c.

The hard bias layers 40 are magnetized in the X-direction (track-width direction). With the bias magnetic field generated by the hard bias layers 40 in the X-direction, magnetization of the second free magnetic layer 37a is aligned in the X-direction.

The free magnetic layer 37 is made up of the second free magnetic layer 37a and the first free magnetic layer 37c, which have magnetic moments different in magnitude from each other and are stacked in that order with the nonmagnetic intermediate layer 37b interposed between them. Also, the free magnetic layer 37 is in a ferri-magnetic state in which the magnetized direction of the second free magnetic layer 37a and the magnetized direction of the first free magnetic layer 37c are antiparallel to each other. Specifically, the magnetized direction of one layer (for example, the second layer 37a) of the first and second free magnetic layers, which has a greater magnetic moment, is aligned in the direction of the magnetic field generated by the hard bias layers 40. Whereas the magnetized direction of the first free magnetic layer 37c is 180°-opposed to the direction of the magnetic field generated by the hard bias layers 40.

When the second free magnetic layer 37a and the first free magnetic layer 37c are in the ferri-magnetic state in which their magnetized directions are 180°-opposed and antiparallel to each other, an effect equivalent to that resulting from reducing a film thickness of the free magnetic layer 37 is obtained. Since that effect reduces the effective magnetic moment of the free magnetic layer 37 per unit area, the magnetization of the free magnetic layer 37 becomes more apt to vary and the magnetic-field detecting sensitivity of the magnetoresistive sensor is improved.

The direction of resultant magnetic moment given by the sum of the magnetic moment of the first free magnetic layer 37c and the magnetic moment of the second free magnetic layer 37a defines the magnetized direction of the free magnetic layer 37.

Incidentally, the magnetized direction of only the second free magnetic layer 37a contributes to an output in relation to the magnetized direction of the pinned magnetic layer 35.

The hard bias layers 40 are only required to align the magnetized direction of one of the second free magnetic layer 37a and the first free magnetic layer 37c, which constitute the free magnetic layer 37. In FIG. 1, the hard bias layers 40 function to only align the magnetized direction of only the second free magnetic layer 37a. With the magnetized direction of the second free magnetic layer 37a aligned in a certain direction, a ferri-magnetic state is established such that the magnetized direction of the first free magnetic layer 37c is made antiparallel to the magnetized direction of the second free magnetic layer 37a. As a result, the magnetized direction in the entirety of the free magnetic layer 37 is aligned in a certain direction.

In this embodiment, the hard bias layers 40 apply a magnetostatic field in the X-direction primarily to the second free magnetic layer 37a. Therefore, the magnetized direction (opposed to the X-direction) of the first free magnetic layer 37c can be prevented from being disturbed by the magnetostatic field generated from the hard bias layers 40 in the X-direction.

Further, and as shown in FIG. 1, the first pinned magnetic layer 35a and the second pinned magnetic layer 35c having magnetic moments different in magnitude from each other are stacked in that order with the nonmagnetic intermediate layer 35b interposed between them, and the resultant stack functions as one pinned magnetic layer 35.

The first pinned magnetic layer 35a is formed in contact with the antiferromagnetic layer 34. With annealing carried out under a magnetic field, an exchange anisotropic magnetic field is generated by exchange coupling at the interface between the first pinned magnetic layer 35a and the antiferromagnetic layer 34, whereby the magnetized direction of the first pinned magnetic layer 35a is pinned in the Z-direction. When the magnetized direction of the first pinned magnetic layer 35a is pinned in the Y-direction, the magnetized direction of the second pinned magnetic layer 35c, which is positioned in an opposite relation to the first pinned magnetic layer 35a (with the nonmagnetic intermediate layer 35b interposed therebetween), is pinned antiparallel to the magnetized direction of the first pinned magnetic layer 35a.

With the first pinned magnetic layer 35a and the second pinned magnetic layer 35c thus held in a ferri-magnetic state in which their magnetized directions are antiparallel to each other, the first pinned magnetic layer 35a and the second pinned magnetic layer 35c mutually interact so as to keep the magnetized direction of the counterpart pinned. As a whole, therefore, the magnetized direction of the pinned magnetic layer 35 can be positively pinned in a certain direction.

The direction of the resultant magnetic moment given by the sum of the magnetic moment of the first pinned magnetic layer 35a and the magnetic moment of the second pinned magnetic layer 35c defines the magnetized direction of the pinned magnetic layer 35.

In the embodiment of FIG. 1, the magnetic moments of the first pinned magnetic layer 35a and the second pinned magnetic layer 35c are made different in magnitude from each other by forming those layers with the same material but in different thicknesses.

Also, a demagnetizing field (dipole magnetic field) due to the pinned magnetization of both the first pinned magnetic layer 35a and the second pinned magnetic layer 35c can be eliminated because magnetostatic fields of the first pinned magnetic layer 35a and the second pinned magnetic layer 35c cancel each other when coupled. It is hence possible to reduce an influence of the demagnetizing field (dipole magnetic field) due to the pinned magnetization of the pinned magnetic layer 35 upon varying magnetization of the free magnetic layer 37.

Accordingly, the direction of varying magnetization of the free magnetic layer 37 can be more easily corrected to a desired direction, and a spin-valve type thin-film magnetoresistive sensor having a small asymmetry, i.e., superior symmetry, can be obtained.

The term "asymmetry" used herein means the degree of asymmetry of a reproduced output waveform. When the reproduced output waveform is nearly symmetric, the asymmetry is small. In other words, as the asymmetry approaches 0, the reproduced output waveform has better symmetry.

The asymmetry becomes 0 when the magnetized direction of the free magnetic layer 37 is perpendicular to the direction of pinned magnetization of the pinned magnetic layer 35. If the asymmetry is increased to a large extent, information cannot be precisely read out of a recording medium and an error may occur. Thus, a spin-valve type thin-film magnetoresistive sensor with a smaller asymmetry has higher reliability in processing of reproduced signals, i.e., better characteristics.

Further, a demagnetizing field (dipole magnetic field) Hd due to pinned magnetization of a pinned magnetic layer has an uneven distribution wherein Hd is large at the ends, but small at the center in the direction of sensor height, and using such a pinned magnetic layer may impede formation of a single domain state in the free magnetic layer 37. In this embodiment, however, since the pinned magnetic layer 35 has the multilayered structure as described above, the dipole magnetic field Hd of the pinned magnetic layer 35 can be made substantially Hd=0. As a result, it is possible to avoid uneven magnetization caused upon formation of magnetic walls in the free magnetic layer 37, and hence to prevent generation of Barkhausen noise, etc.

The provision of the intermediate layer 41 of Ta or Cr between the first electrode layer 42 and the hard bias layer 40 is effective to avoid thermal diffusion and contributes to preventing deterioration in magnetic characteristics of the hard bias layer 40.

When Ta is used as the first electrode layer 42, the provision of the intermediate layer 41 of Cr is preferable in that the crystal structure of the Ta layer formed on Cr is more easily brought into a body-centered cubic structure having lower resistance.

Also, when Cr is used as the first electrode layer 42, the provision of the intermediate layer 41 of Ta promotes epitaxial growth of Cr and reduces a resistance value.

The magnetoresistive sensor shown in FIG. 1 is the so-called spin-valve type magnetoresistive sensor in which the magnetized direction of the pinned magnetic layer 35 is properly pinned in a direction parallel to the Y-direction (as shown in the figure), and the magnetization of the free magnetic layer 37 is properly aligned in the X-direction so that the pinned magnetic layer 35 and the free magnetic layer 37 are perpendicular to each other in their magnetized directions. Then, the magnetized direction of the free magnetic layer 37 is varied with high sensitivity depending on an external magnetic field applied from a recording medium, and the value of electrical resistance is changed depending on the relationship between a variation in the magnetized direction of the free magnetic layer 37 and the pinned magnetized direction of the pinned magnetic layer 35. A leakage magnetic field from the recording medium is detected in accordance with the voltage change caused by a change in the value of electrical resistance.

In this respect, the change in the value of electrical resistance (i.e., output) is directly affected by a relative angle formed between the magnetized direction of the second pinned magnetic layer 35c and the magnetized direction of the second free magnetic layer 37a. That relative angle is preferably just a right angle in a state in which a sensing electric current is supplied and a signal magnetic field is not applied.

In this embodiment, the first electrode layers 42, 42 and the second electrode layers 43, 43 constitute a pair of electrode portions L, L of a two-layered structure. The first electrode layers 42, 42 are lowermost electrode layers in the magnetoresistive sensor of the present invention.

Also, in this embodiment, assuming that the distance between the upper shield layer 45 and the lower shield layer 31 in areas S, S, which overlap only lowermost ones 42, 42 of the first electrode layers 42, 42 and the second electrode layers 43, 43, is G1s, and the distance between the upper shield layer 45 and the lower shield layer 31 at a position in alignment with the center C of the multilayered film T is G1c, a difference in value between G1s and G1c is set to be not larger than a predetermined value such that an effective track width E-Tw of the magnetoresistive sensor has a value equal to or below 0.17 μm. The term "effective track width E-Tw" means an actual track width of a magnetoresistive sensor measured by, e.g., the full-track profile method or the micro-track profile method. In general, when the optical track width O-Tw is not larger than 0.2 μm, the relationship E-Tw>O-Tw tends to occur. Note that the distance G1c between the upper shield layer 45 and the lower shield layer 31 at a position in alignment with the center C of the multilayered film T means the so-called gap length.

More specifically, values of G1s and G1c are preferably set to satisfy the range of G1c−20 nm≦G1s≦G1c+90 nm. More preferably, values of G1s and G1c are set to satisfy the range of G1c−20 nm≦G1s≦G1c+70 nm. Even more preferably, values of G1s and G1c are set to satisfy the range of G1c−20 nm≦G1s≦G1c+30 nm.

Stated otherwise, values of G1s and G1c are preferably set to satisfy the range of 0.67≦G1s/G1c≦2.50. More preferably, values of G1s and G1c are set to satisfy the range of 0.67≦G1s/G1c≦2.17. Even more preferably, values of G1s and G1c are set to satisfy the range of 0.67 ≦G1s/G1c≦1.50.

In FIG. 1, values of G1s and G1c are set such that G1s>G1c holds while satisfying the range defined above for the values of G1s and G1c. Thus, the upper surface of the first electrode layer 42 is positioned above the surface of the multilayered film T (in the Y-direction as shown).

Since the first electrode layers 42, 42 are disposed on both sides of the multilayered film T in an adjacent relation, the distance G1s between the upper shield layer 45 and the lower shield layer 31 in the areas S, S, which overlap only the first electrode layers 42, 42, means the distance between the upper shield layer 45 and the lower shield layer 31 near the multilayered film T on both sides thereof.

If the distance between the upper shield layer 45 and the lower shield layer 31 near the multilayered film T on both sides thereof is increased, magnetic fields generated from recording tracks of a recording medium on both sides of a recording track under detection are more likely to enter the magnetoresistive sensor through spacing between the upper shield layer 45 and the lower shield layer 31, resulting in a larger value of the effective track width ETw. In other words, crosstalk between adjacent recording tracks is more apt to occur.

In fact, as will be described later, as the difference value between G1s and G1c increases, the effective track width E-Tw of the magnetoresistive sensor is also increased.

In this embodiment, by setting the difference in value between G1s and G1c to be not larger than the predetermined value, it is possible to suppress an increase in the distance between the upper shield layer 45 and the lower shield layer 31 near the multilayered film T on both sides thereof, and hence reduce the effective track width E-Tw.

When reducing the distance between the upper shield layer 45 and the lower shield layer 31 in the vicinity of the multilayered film T on both sides thereof, however, there occurs a need to reduce the film thickness of the first electrode layers 42, which are formed on both sides of the multilayered film T and which supply a direct current to the multilayered film T. That need increases a direct-current resistance value of the magnetoresistive sensor.

In this embodiment, the electrode portion L is formed as a thin single layer constituted only by the first electrode layer near the multilayered film T, and the film thickness of the electrode portion L in an area away from the multilayered film T is increased by forming the second electrode layer on the first electrode layer.

Consequently, the direct-current resistance value of the magnetoresistive sensor can be reduced while reducing the distance between the upper shield layer 45 and the lower shield layer 31 near the multilayered film T on both sides thereof.

Also, since the first electrode layer 42 is formed as a thin layer near the multilayered film T, a step (level difference) D formed by a lateral slope 42a of the first electrode layer 42 (i.e., between the surface of the multilayered film T and the upper surface of the first electrode layer 42) can be reduced. Therefore, even when the film thickness of the upper gap layer 44 is reduced, the upper gap layer 44 can be formed on the step D. An electrical short-circuit between the upper shield layer 45 and the electrode portion L can be thus prevented with high reliability.

Additionally, an angle θ1 formed between a plane parallel to the surface of the multilayered film T and a plane tangential to the front edge of the second electrode layer 43 is smaller than an angle θ2 formed between the plane parallel to the surface of the multilayered film T and a plane tangential to the front edge of the first electrode layer 42.

Moreover, the second electrode layer 43 has a film thickness t2 larger than a film thickness t1 of the first electrode layer 42.

Figure 2:
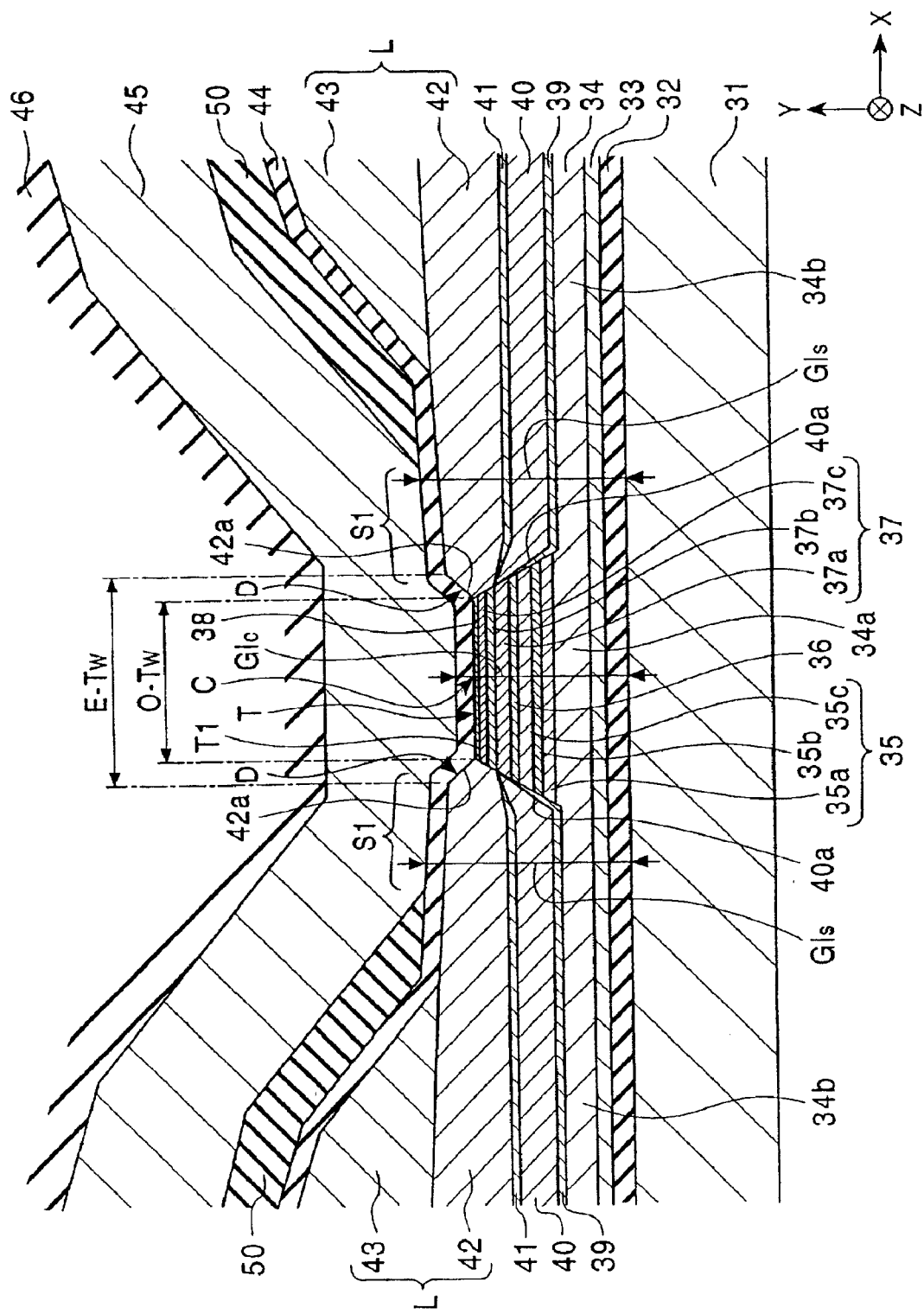
FIG. 2 is a sectional view of a magnetoresistive sensor according to a second embodiment of the present invention, looking from the side facing a recording medium.

FIG. 2 is a sectional view of a magnetoresistive sensor according to a second embodiment of the present invention, looking from the side facing a recording medium.

The magnetoresistive sensor of this second embodiment differs from that of the first embodiment only in that insulating layers 50, 50 are formed to cover parts of the first electrode layers 42, 42 serving as the lowermost electrode layers, and to cover entire areas of the second electrode layers 43, 43.

In this second embodiment, electrical short-circuits between the upper shield layer 45 and the electrode portions L, L can be more positively prevented with the provision of the insulating layers 50, 50.

Also, in this second embodiment, assuming that the distance G1s is between the upper shield layer 45 and the lower shield layer 31 in areas which overlap only lowermost ones 42, 42 of the first electrode layers 42, 42 and the second electrode layers 43, 43, but do not overlap the insulating layers 50, 50, and the distance G1c is between the upper shield layer 45 and the lower shield layer 31 at a position in alignment with the center C of the multilayered film T, a difference in value between G1s and G1c is set to be not larger than a predetermined value such that an effective track width E-Tw of the magnetoresistive sensor has a value equal to or below 0.17 μm. The term "effective track width E-Tw" means an actual track width of a magnetoresistive sensor measured by, e.g., the full-track profile method or the micro-track profile method. In general, when the optical track width O-Tw is not larger than 0.2 μm, the relationship E-Tw>O-Tw tends to occur.

More specifically, values of G1s and G1c are preferably set to satisfy the range of G1c−20 nm≦G1s≦G1c+90 nm. More preferably, values of G1s and G1c are set to satisfy the range of G1c−20 nm≦G1s≦G1c+70 nm. Even more preferably, values of G1s and G1c are set to satisfy the range of G1c−20 nm≦G1s≦G1c+30 nm.

Stated otherwise, values of G1s and G1c are preferably set to satisfy the range of 0.67≦G1s/G1c≦2.50. More preferably, values of G1s and G1c are set to satisfy the range of 0.67≦G1s/G1c≦2.17. Even more preferably, values of G1s and G1c are set to satisfy the range of 0.67≦G1s/G1c≦1.50.

In this second embodiment, as with the first embodiment, by setting the difference in value between G1s and G1c to be not larger than the predetermined value, it is possible to suppress an increase in the distance between the upper shield layer 45 and the lower shield layer 31 near the multilayered film T on both sides thereof, and hence to reduce the effective track width E-Tw.

Further, in this second embodiment, the electrode portion L is formed as a thin single layer constituted only by the first electrode layer near the multilayered film T, and the film thickness of the electrode portion L in an area away from the multilayered film T is increased by forming the second electrode layer on the first electrode layer.

Consequently, the direct-current resistance value of the magnetoresistive sensor can be reduced while keeping the distance small between the upper shield layer 45 and the lower shield layer 31 near the multilayered film T on both sides thereof.

Also, since the first electrode layer 42 is formed as a thin layer near the multilayered film T, the step (level difference) D formed by the lateral slope 42a of the first electrode layer 42 relative to the surface of the multilayered film T can be reduced. Therefore, even when the film thickness of the upper gap layer 44 is reduced, the upper gap layer 44 can be formed on the step D. An electrical short-circuit between the upper shield layer 45 and the electrode portion L can be thus prevented with high reliability.

Figure 3:
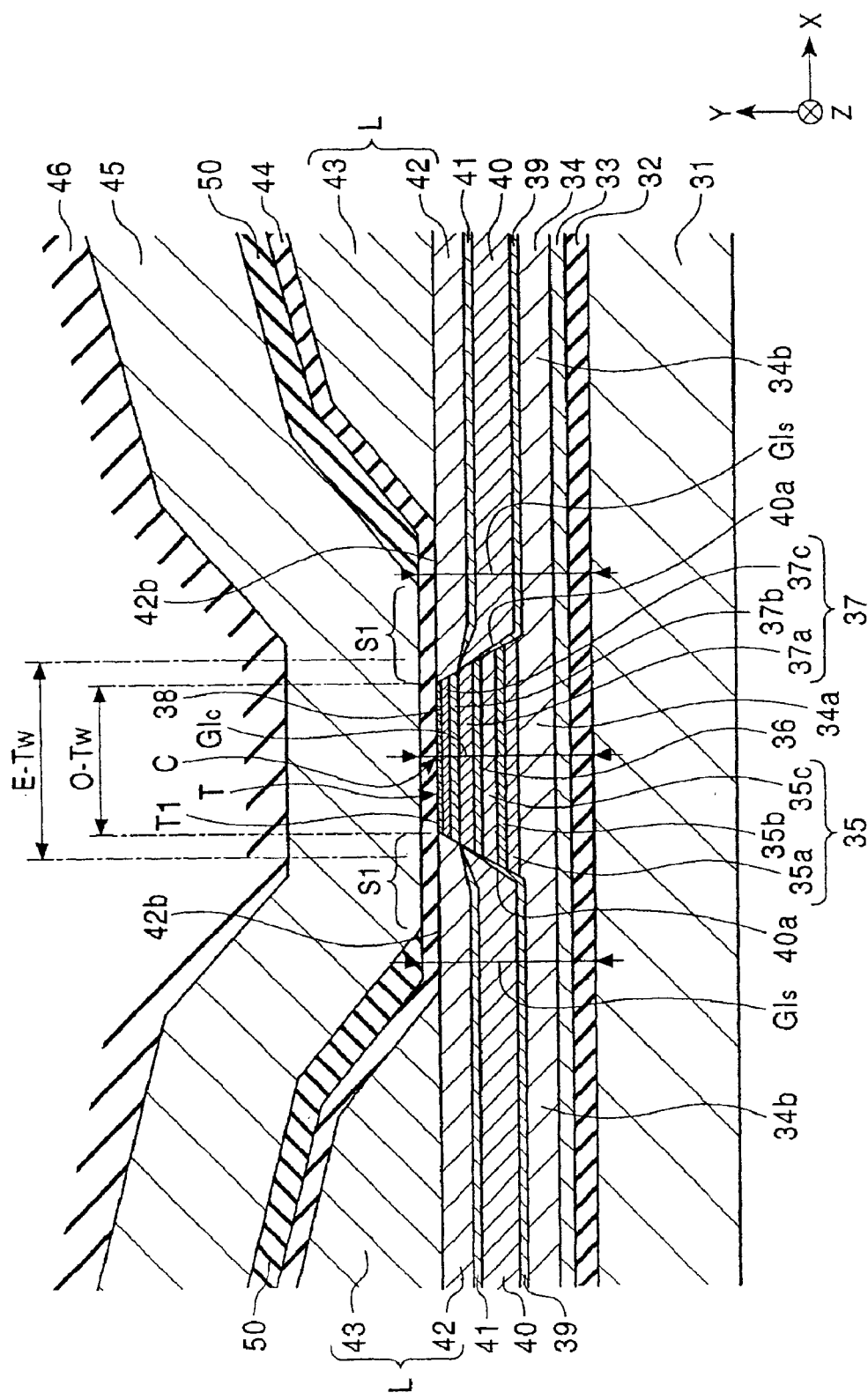
FIG. 3 is a sectional view of a magnetoresistive sensor according to a third embodiment of the present invention, looking from the side facing a recording medium.
Figure 4:
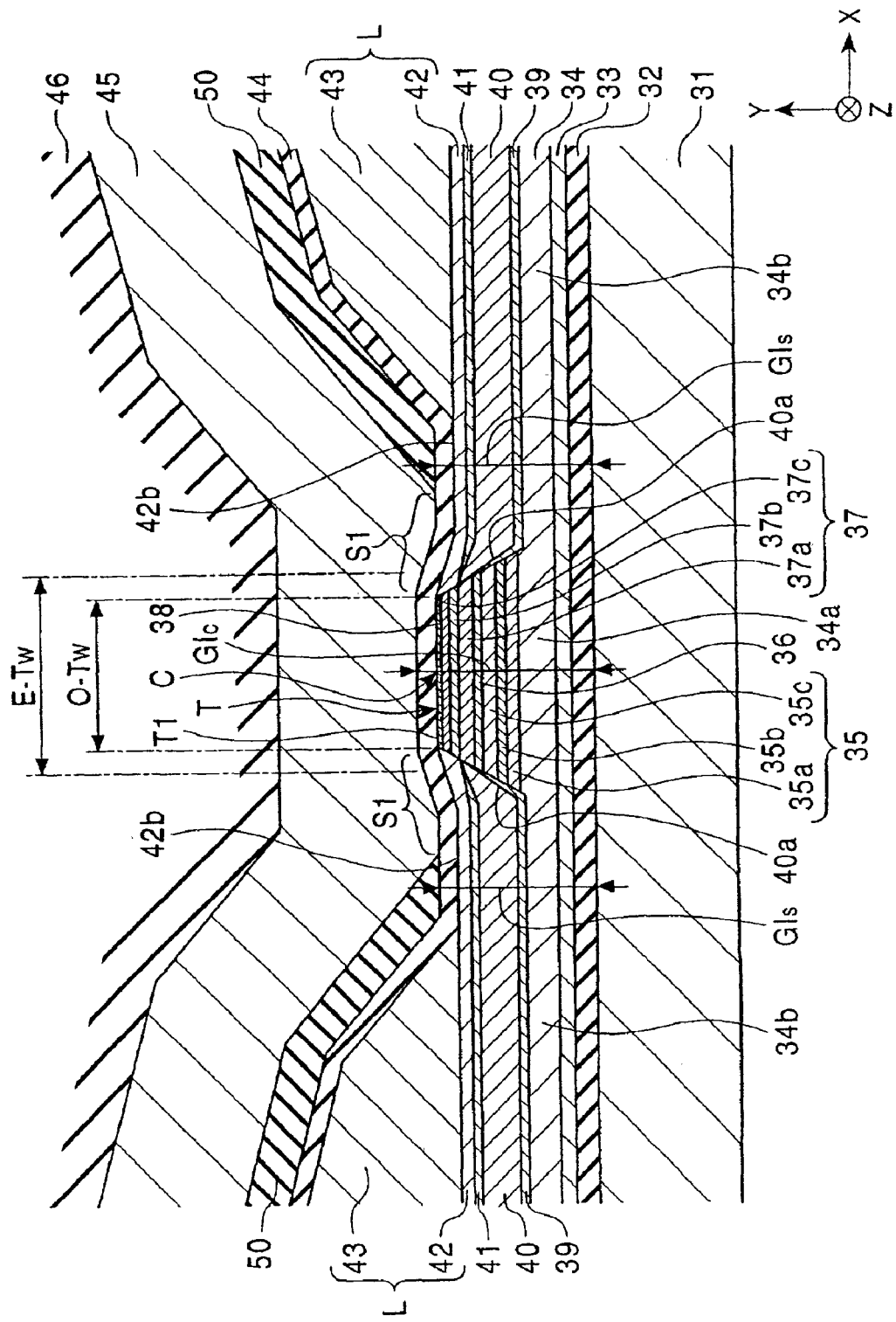
FIG. 4 is a sectional view of a magnetoresistive sensor according to a fourth embodiment of the present invention, looking from the side facing a recording medium.
Figure 5:
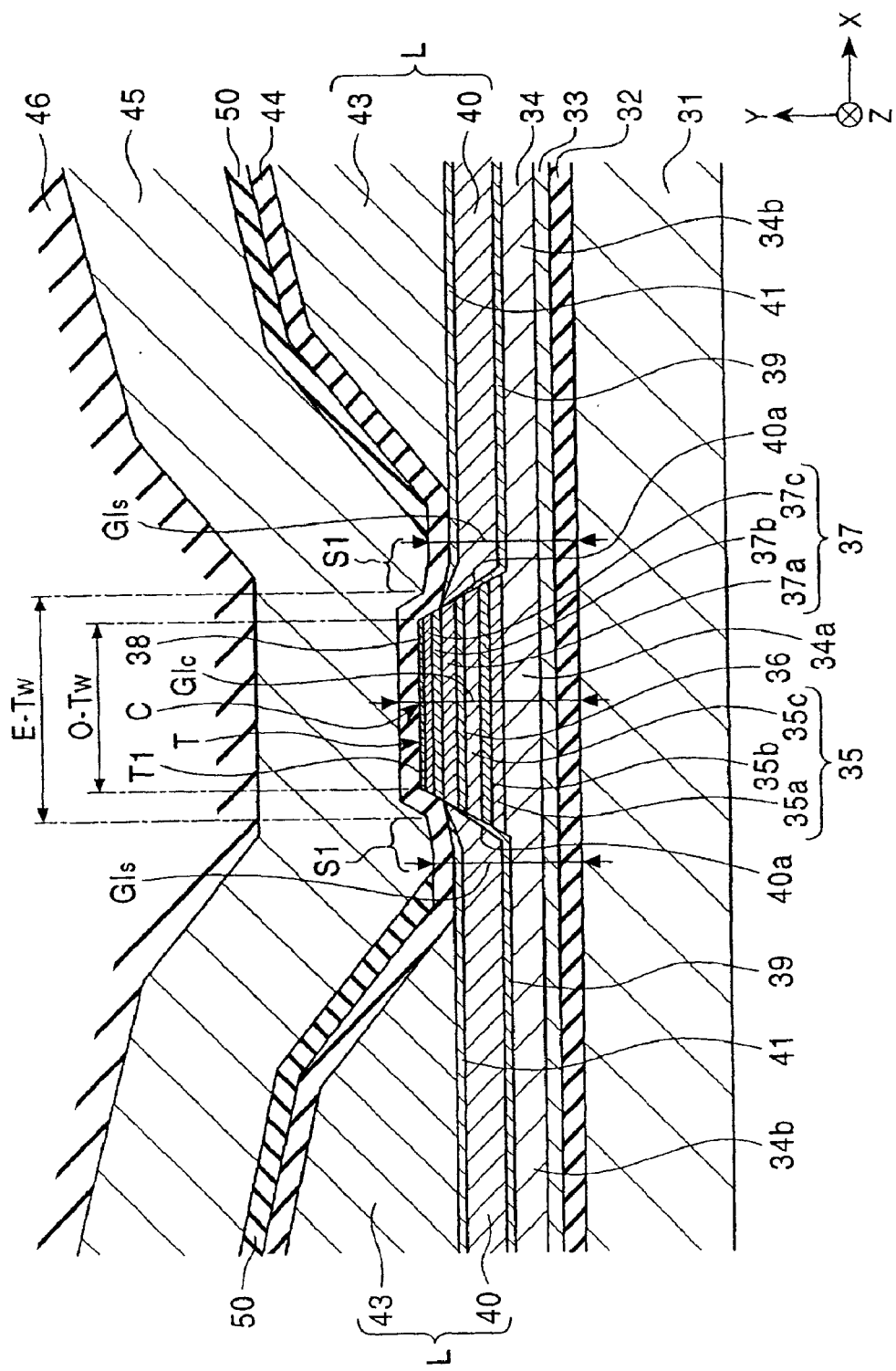
FIG. 5 is a sectional view of a magnetoresistive sensor according to a fifth embodiment of the present invention, looking from the side facing a recording medium.

FIGS. 3, 4 and 5 are sectional views of respective magnetoresistive sensors according to third, fourth and fifth embodiments of the present invention, looking from the side facing a recording medium.

The magnetoresistive sensor of FIG. 3 differs from that of FIG. 2 only in that the values of G1s and G1c satisfy G1s=G1c in FIG. 3, while those values satisfy G1s>G1c in FIG. 2. Stated otherwise, in the magnetoresistive sensor of FIG. 3, an upper surface 42b of the first electrode layer 42(i.e., the lowermost electrode layer) and a surface T1 of the multilayered film T are at the same level of height (in the Y-direction, or namely, in the direction toward the trailing side).

The magnetoresistive sensor of FIG. 4 differs from that of FIG. 2 only in that the values of G1s and G1c satisfy G1s<G1c in FIG. 4, while those values satisfy G1s>G1c in FIG. 2. Stated otherwise, in the magnetoresistive sensor of FIG. 4, the upper surface 42b of the first electrode layer 42(i.e., the lowermost electrode layer) is positioned at a level lower than the surface T1 of the multilayered film T (in the Y-direction).

In the magnetoresistive sensor of FIG. 5, the first electrode layers 42, 42 in the magnetoresistive sensor of FIG. 2 are not formed. More specifically, in the magnetoresistive sensor of FIG. 5, the hard bias layers 40, 40 also serve as the lowermost electrode layers in the present invention. The second electrode layers 43, 43 of, for example, Cr, Au, Ta, W, Rh, Ir, Ru or Cu, are formed on the hard bias layers 40, 40. A spacing between the pair of electrodes defined by the second electrode layers 43, 43 in the track-width direction is larger than that between the hard bias layers 40, 40.

The upper gap layer 44 is formed to cover the surface of the multilayered film T, the surfaces of the intermediate layers 41, and the surfaces of the second electrode layers 43, 43. Further, the insulating layers 50, 50 are formed to cover parts of the hard bias layers 40, 40 serving as the lowermost electrode layers, and to cover entire areas of the second electrode layers 43, 43. The upper shield layer 45 is formed on the upper gap layer 44 and the insulating layers 50, 50.

Note that the hard bias layers 40, 40 and the second electrode layers 43, 43 jointly constitute the electrode portions L, L.

In the magnetoresistive sensors according to the embodiments shown in FIGS. 1 to 5, the antiferromagnetic layer 34 has a structure such that a raised portion 34a is formed in a central area of the antiferromagnetic layer 34, and extended portions 34b, 34b are formed to extend over long distances in the track-width direction (X-direction as shown in the figures) from opposite base ends of the raised it portion 34a as viewed in the track-width direction.

In the structure where the antiferromagnetic layer 34 has the extended portions 34b, 34b, and the hard bias layers 40, 40 are formed on the extended portions 34b, 34b with the bias underlying layers 39, 39 interposed therebetween, the hard bias layers 40, 40 having sufficient volumes can be formed in contact with the opposite end surfaces of the free magnetic layer 37.

Figure 6:
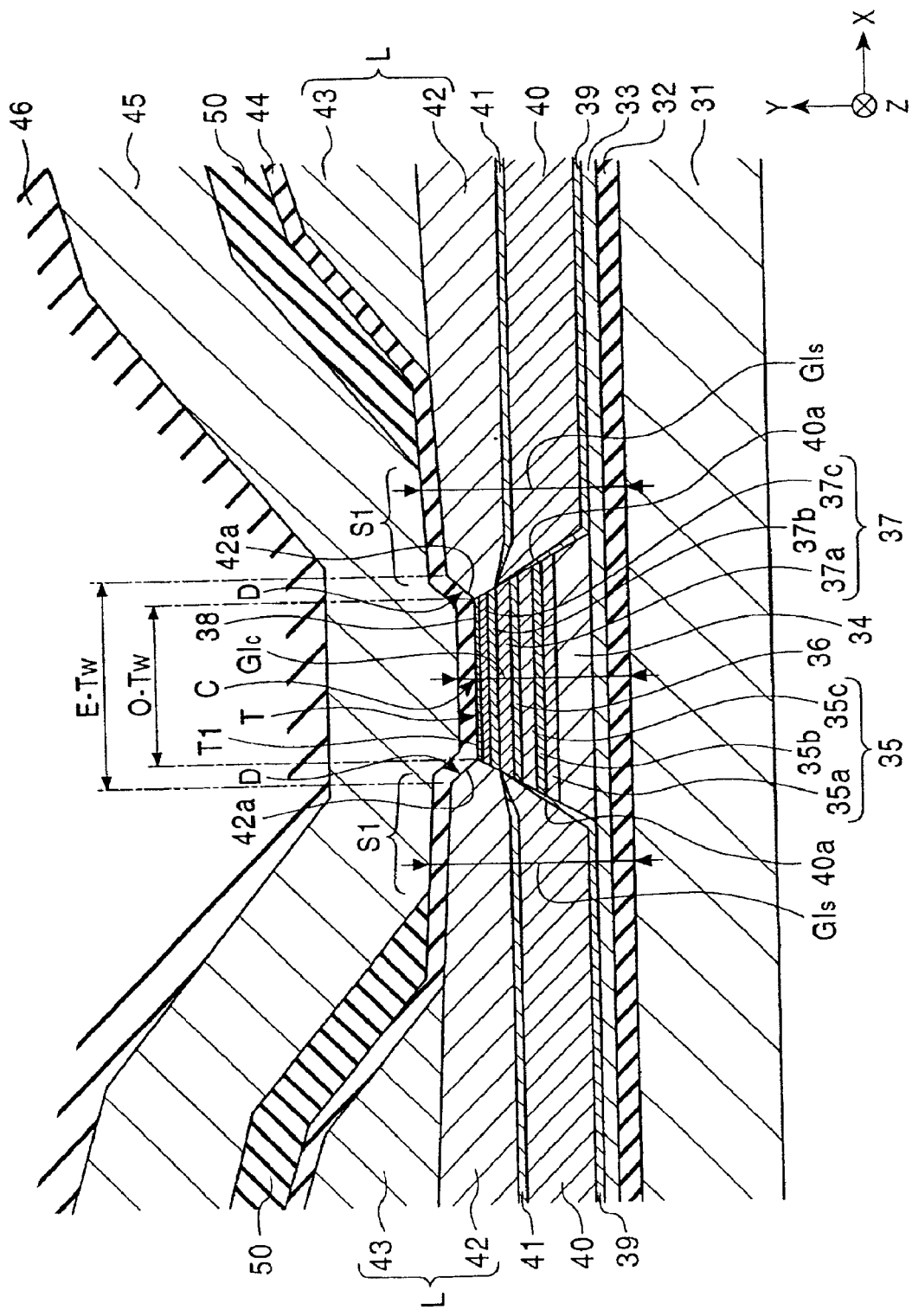
FIG. 6 is a sectional view of a magnetoresistive sensor according to a sixth embodiment of the present invention, looking from the side facing a recording medium.

As shown in FIG. 6, however, the extended portions 34b may not be formed in the antiferromagnetic layer 34. Also, the structure of FIG. 6 may be modified such that the underlying layer 33 is formed in contact with only the underside of the antiferromagnetic layer 34 and the bias underlying layer 39 in direct contact with the lower gap layer 32.

Figure 7:
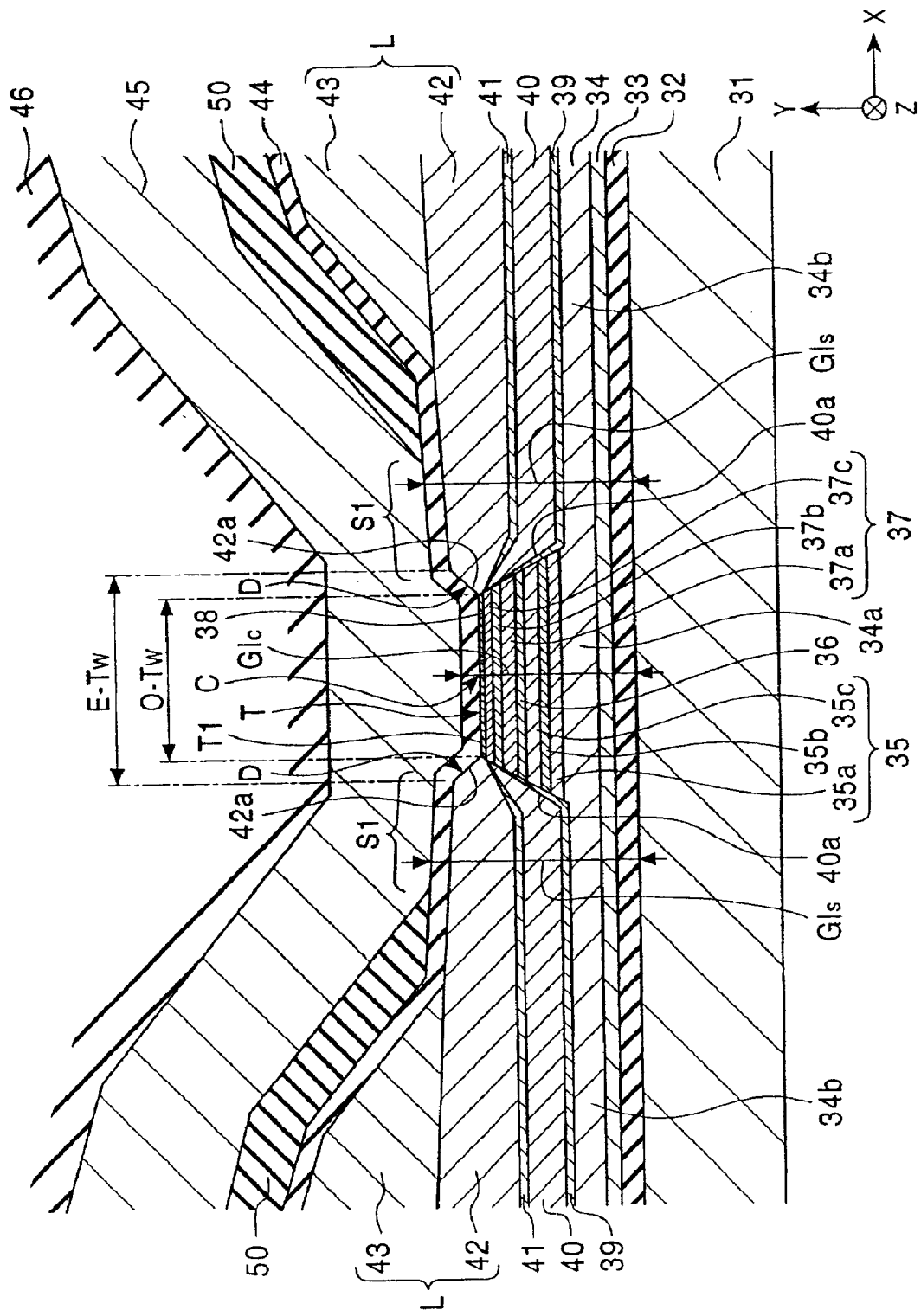
FIG. 7 is a sectional view of a magnetoresistive sensor according to a seventh embodiment of the present invention, looking from the side facing a recording medium.

Further, in the magnetoresistive sensors according to the embodiments shown in FIGS. 1 to 6, the lateral surface 40a of each of the hard bias layers 40 positioned to face the multilayered film T is extended to cover only the lateral surface of the pinned magnetic layer 35, the lateral surface of the nonmagnetic material layer 36 and the lateral surface of the second free magnetic layer 37a, but not to cover the lateral surface of the first free magnetic layer 37c. As shown in FIG. 7, however, the lateral surface 40a of each of the hard bias layers 40 positioned to face the multilayered film T may be extended to cover the lateral surface of the pinned magnetic layer 35, the lateral surface of the nonmagnetic material layer 36, and the respective lateral surfaces of the second free magnetic layer 37a, the nonmagnetic intermediate layer 37b and the first free magnetic layer 37c.

Figure 8:
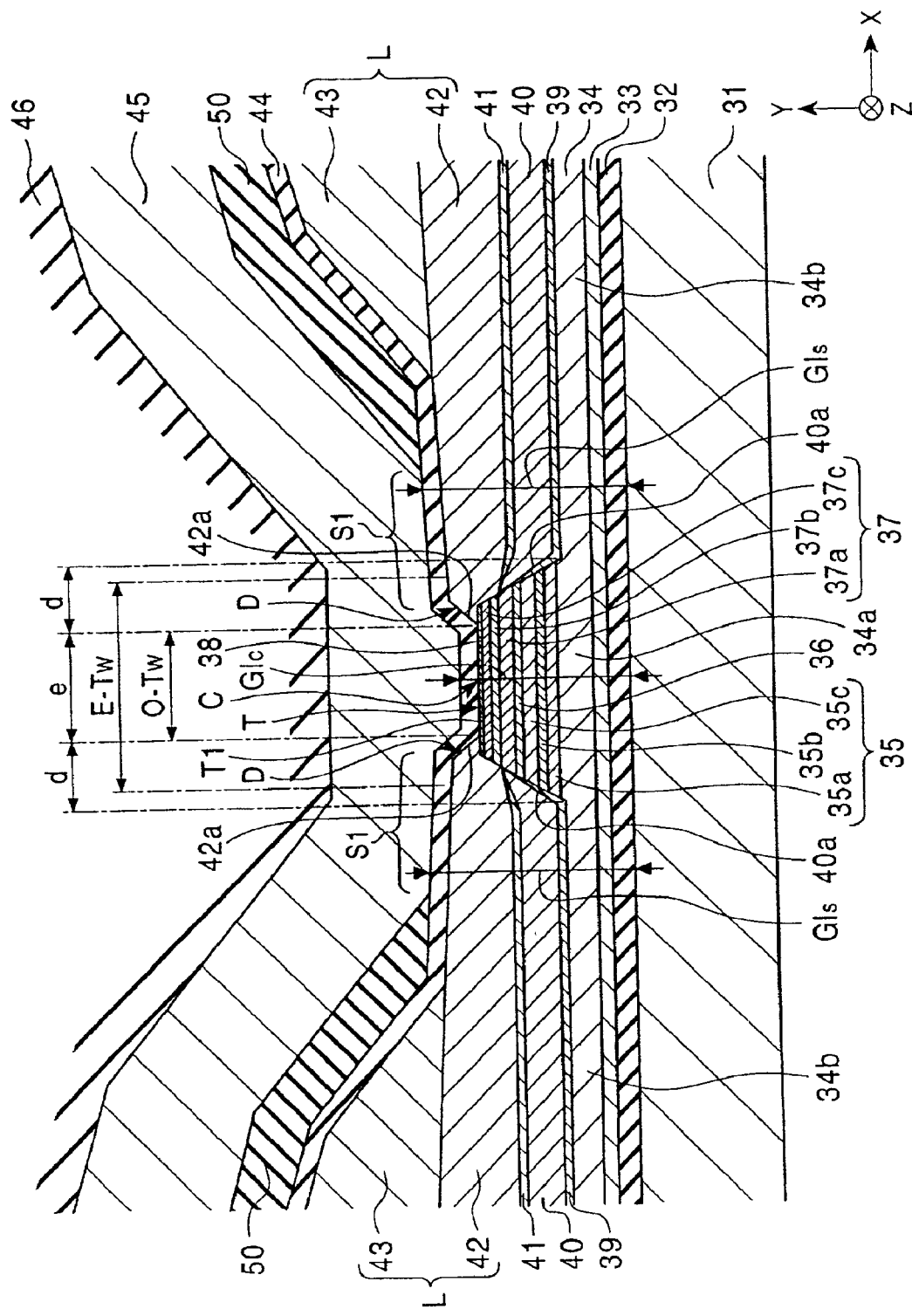
FIG. 8 is a sectional view of a magnetoresistive sensor according to an eighth embodiment of the present invention, looking from the side facing a recording medium.

FIG. 8 is a sectional view of a magnetoresistive sensor according to an eighth embodiment of the present invention, looking from the side facing a recording medium.

The magnetoresistive sensor of this eighth embodiment shown in FIG. 8 differs from that of the second embodiment shown in FIG. 2 only in that the first electrode layers 42, 42 are formed to extend over dead zones d, d of the multilayered film T.

The magnetization of the free magnetic layer 37 is aligned in the X-direction, as shown in the figure, by the bias magnetic field applied from the hard bias layers 40, 40 in the X-direction.

As shown in FIG. 8, an area corresponding to a central portion of the multilayered film T serves as a sensitive zone e, and areas on both sides of the sensitive zone e are dead zones d, d.

In the sensitive zone e, the magnetization of the pinned magnetic layer 35 is properly pinned in the Z-direction, and the magnetization of the free magnetic layer 37 is properly aligned in the X-direction, so that the pinned magnetic layer 35 and the free magnetic layer 37 are perpendicular to each other in their magnetized directions. Then, the magnetized direction of the free magnetic layer 37 is varied with high sensitivity depending on the external magnetic field applied from the recording medium, and the value of electrical resistance is changed depending on the relationship between a variation in the magnetized direction of the free magnetic layer 37 and the pinned magnetized direction of the pinned magnetic layer 35. A leakage magnetic field from the recording medium is detected in accordance with a voltage change caused upon a change in the value of electrical resistance.

Thus, the sensitive zone e of the multilayered film T refers to an area in which the magnetoresistive effect is essentially developed and the reproducing function works effectively in the sensitive zone e.

On the other hand, in the dead zones d, d on both sides of the sensitive zone e, the magnetization of both the pinned magnetic layer 35 and the free magnetic layer 37 is strongly affected by the magnetic field applied from the hard bias layers 40, 40, and the magnetization of the free magnetic layer 37 is relatively difficult to vary depending on the external magnetic field. Thus, the dead zones d, d refers to areas in which the magnetoresistive effect is weak and the reproducing function is poor.

In the eighth embodiment of FIG. 8, the first electrode layers 42, 42 are formed to extend over the dead zones d, d of the multilayered film T. With this structure, sensing electric currents are harder to flow from the electrode portions L, L to the hard bias layers 40, 40, and the proportion of the sensing electric currents directly flowing into the multilayered film T without passing the hard bias layers 40, 40 is increased. Also, since the extension of the first electrode layers 42, 42 over the dead zones d, d increases the area in which the multilayered film T and the first electrode layers 42, 42 are joined to each other, the direct-current resistance value (DCR) can be reduced and reproduction characteristics can be improved.

Further, with the first electrode layers 42, 42 formed to extend over the dead zones d, d, the sensing electric currents are suppressed from flowing into the dead zones d, d and from generating noise.

Figure 9:
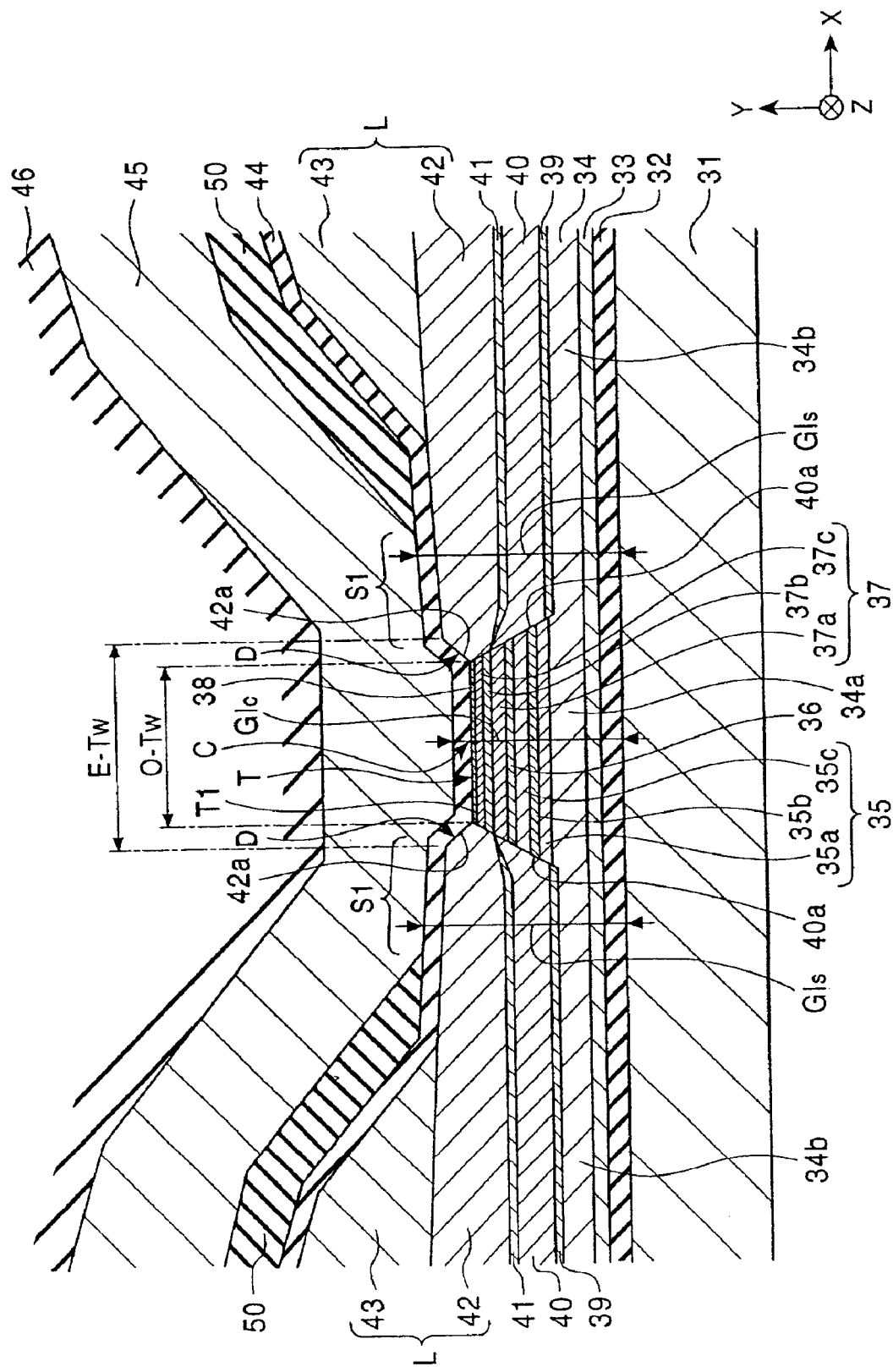
FIG. 9 is a sectional view of a magnetoresistive sensor according to a ninth embodiment of the present invention, looking from the side facing a recording medium.

FIG. 9 is a sectional view of a magnetoresistive sensor according to a ninth embodiment of the present invention, looking from the side facing a recording medium.

In the magnetoresistive sensor shown in FIG. 9, the bias underlying layers 39, 39 are formed only on the extended portions 34b, 34b of the antiferromagnetic layer 34 of the multilayered film T. Accordingly, the lateral surfaces 40a, 40a of the hard bias layers 40, 40 on the sides facing the multilayered film T are in direct contact with the opposite lateral surfaces of the second free magnetic layer 37a. With that structure, the hard bias layers 40, 40 and the second free magnetic layer 37a form a magnetically continuous body. As a result, it is possible to prevent demagnetizing fields from being generated at the opposite lateral ends of the second free magnetic layer 37a, and to increase stability.

Even in the structure in which the bias underlying layers 39, 39 are formed on the opposite lateral surfaces of the multilayered film T, when the bias underlying layers 39, 39 are not formed on the opposite lateral surfaces of both the second free magnetic layer 37a and the first free magnetic layer 37c, and the hard bias layers 40, 40 can be formed in direct contact with the opposite lateral surfaces of the second free magnetic layer 37a.

Further, even in the structure in which the bias underlying layers 39, 39 are formed between the hard bias layers 40, 40 and the second free magnetic layer 37a, if each of the bias underlying layers 39, 39 between the hard bias layers 40, 40 and the second free magnetic layer 37a has a film thickness of not larger than 1 nm, the hard bias layers 40, 40 and the second free magnetic layer 37a form a magnetically continuous body through pinholes produced in the bias underlying layers 39, 39. As a result, it is similarly possible to prevent demagnetizing fields from being generated at the opposite lateral ends of the second free magnetic layer 37a, and to increase stability.

Also, in the magnetoresistive sensors shown in FIGS. 3 to 9, assuming that the distance $G1s$ is between the upper shield layer 45 and the lower shield layer 31 in areas S1, S1, which overlap only lowermost ones of the lowermost electrode layers (first electrode layers 42, 42 or hard bias layers 40, 40) and the second electrode layers 43, 43, but do not overlap the insulating layers 50, 50, and the distance $G1c$ is between the upper shield layer 45 and the lower shield layer 31 at a position in alignment with the center C of the multilayered film T, a difference in value between $G1s$ and $G1c$ is set to be not larger than a predetermined value such that an effective track width E-Tw of the magnetoresistive sensor has a value equal to or below 0.17 μm. The effective track width E-Tw is measured by, e.g., the full-track profile method or the micro-track profile method.

More specifically, values of $G1s$ and $G1c$ are preferably set to satisfy the range of $G1c-20$ nm$\leq G1s \leq G1c+90$ nm. More preferably, values of $G1s$ and $G1c$ are set to satisfy the range of $G1c-20$ nm$\leq G1s \leq G1c+70$ nm. Even more preferably, values of $G1s$ and $G1c$ are set to satisfy the range of $G1c-20$ nm$\leq G1s \leq G1c+30$ nm.

Stated otherwise, values of $G1s$ and $G1c$ are preferably set to satisfy the range of $0.67 \leq G1s/G1c \leq 2.50$. More preferably, values of $G1s$ and $G1c$ are set to satisfy the range of $0.67 \leq G1s/G1c \leq 2.17$. Even more preferably, values of $G1s$ and $G1c$ are set to satisfy the range of $0.67 \leq G1s/G1c \leq 1.50$.

In the embodiments shown in FIGS. 3 to 9, as with the ok above-described embodiments, by setting the difference in value between $G1s$ and $G1c$ to be not larger than the predetermined value, it is possible to suppress an increase in the distance between the upper shield layer 45 and the lower shield layer 31 near the multilayered film T on both sides thereof, and to hence reduce the effective track width E-Tw.

Further, in those embodiments, the electrode portion L is formed as a thin single layer constituted only by the first electrode layer or the hard bias layer near the multilayered film T, and the film thickness of the electrode portion L in an area away from the multilayered film T is increased by forming the second electrode layer on the first electrode layer or the hard bias layer.

Consequently, the direct-current resistance value of the magnetoresistive sensor can be reduced while keeping the distance small between the upper shield layer 45 and the lower shield layer 31 near the multilayered film T on both sides thereof.

In the embodiments shown in FIGS. 1 to 9, the free magnetic layer 37 is brought into a single domain state using the hard bias layers 40, 40 made of a ferromagnetic material and having a high capability to align the magnetization of the free magnetic layer 37 in a certain direction.

Generally, in the structure using the hard bias layer, the electrode portion must be formed so as to overlie the hard bias layer. Therefore, a step formed by a lateral slope of the electrode portion, i.e., between the surface of the multilayered film and the upper surface of the electrode portion, is increased, and it becomes harder to form the upper gap layer with high reliability.

In those embodiments, since the electrode portion L is formed as a thin layer near the multilayered film T, a step (level difference) D formed by the lateral slope of the electrode portion L relative to the surface of the multilayered film T can be reduced. Therefore, the upper gap layer 44 can be adequately formed on the step D. An electrical short-circuit between the upper shield layer 45 and the electrode portion L can be thus prevented with high reliability. Incidentally, setting the difference in value between G1s and G1c to be not larger than the predetermined value is not always required to obtain the advantage of preventing an electrical short-circuit between the upper shield layer 45 and the electrode portion L with high reliability.

Figure 10:
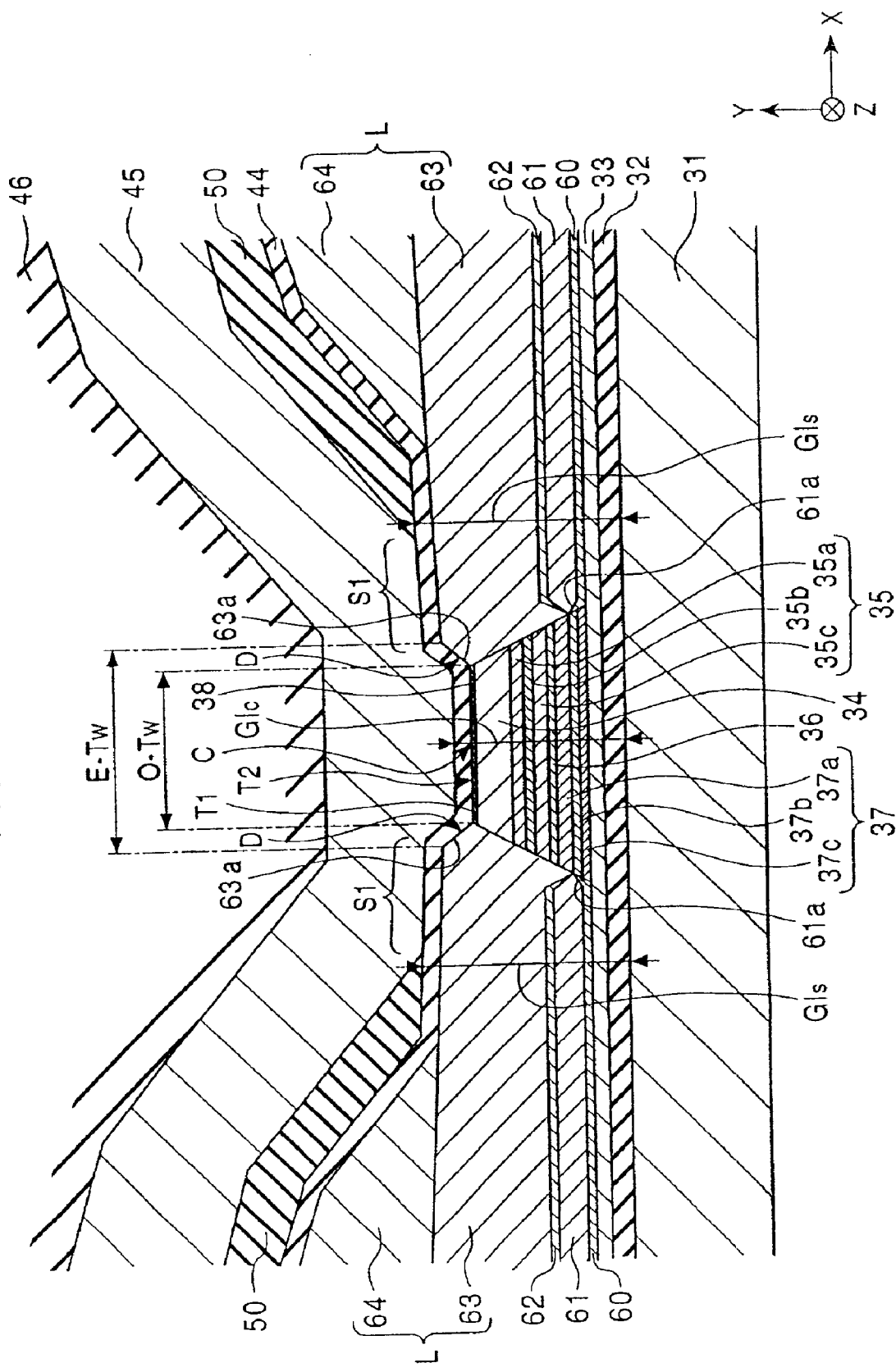
FIG. 10 is a sectional view of a magnetoresistive sensor according to a tenth embodiment of the present invention, looking from the side facing a recording medium.

FIG. 10 is a sectional view of a magnetoresistive sensor according to a tenth embodiment of the present invention, looking from the side facing a recording medium.

In the magnetoresistive sensor shown in FIG. 10, a multilayered film T2 has a structure stacked in an order reversed from the multilayered film T of each of the magnetoresistive sensors shown in FIGS. 1 to 9. More specifically, in FIG. 10, a synthetic ferri-free type free magnetic layer 37 made up of a first free magnetic layer 37c, a nonmagnetic intermediate layer 37b and a second free magnetic layer 37a, a nonmagnetic material layer 36, a synthetic ferri-pinned type pinned magnetic layer 35 made up of a second pinned magnetic layer 35c, a nonmagnetic intermediate layer 35b and a first pinned magnetic layer 35a, an antiferromagnetic layer 34, and a protective barrier layer 38 are successively formed on the underlying layer 33 in that order.

In this tenth embodiment, the first free magnetic layer 37c of the multilayered film T2 is formed below the antiferromagnetic layer 34 and is positioned adjacent to hard bias layers 61, 61 each having a large thickness. Accordingly, magnetization of the free magnetic layer 37 is easily aligned in the X-direction, and hence the occurrence of Barkhausen noise can be reduced.

Bias underlying layers 60 of Cr, for example, are formed so as to cover, in a contact relation, an upper surface of the underlying layer 33 and opposite lateral surfaces of the second free magnetic layer 37. Hard bias layers 61 of a Co—Pt (cobalt-platinum) alloy or a Co—Cr—Pt (cobalt-chromium-platinum) alloy, for example, are formed on the bias underlying layers 60.

Intermediate layers 62 of a nonmagnetic material, such as Ta, are formed on the hard bias layers 61, and first electrode layers 63, 63 of, for example, Cr, Au, Ta, W, Rh, Ir, Ru or Cu, are formed on the intermediate layers 62.

The first electrode layers 63, 63 are constituted as a pair of electrodes formed in areas on both sides of the multilayered film T2 with a predetermined spacing left therebetween in the track-width direction. Second electrode layers 64, 64 of, for example, Cr, Au, Ta, Cu, Rh, Ir, Ru or W, are formed on the first electrode layers 63, 63. The second electrode layers 64, 64 constitute a pair of electrodes having a spacing therebetween in the track-width direction, which is set to be larger than the spacing between the first electrode layers 63, 63.

An upper gap layer 44 is formed on a surface of the multilayered film T2, surfaces of the first electrode layers 63, 63, and surfaces of the second electrode layers 64, 64. An upper shield layer 45 is formed on the upper gap layer 44. The upper shield layer 45 is covered with a protective barrier layer 46 of an inorganic insulating material.

The hard bias layers 61 are only required to align the magnetized direction of one of the second free magnetic layer 37a and the first free magnetic layer 37c, which constitute the free magnetic layer 37. In FIG. 10, lateral surfaces 61a of the hard bias layers 61 are positioned to face only the opposite lateral surfaces of the first free magnetic layer 37c, and the hard bias layers 61 function to align the magnetized direction of only the first free magnetic layer 37c. With the magnetized direction of the first free magnetic layer 37c aligned in a certain direction, the ferri-magnetic state is established such that the magnetized direction of the second free magnetic layer 37a is made antiparallel to the magnetized direction of the first free magnetic layer 37c. As a result, the magnetized direction in the entirety of the free magnetic layer 37 is aligned in a specific direction.

In this tenth embodiment, the hard bias layers 61 apply a magnetostatic field in the X-direction primarily to the first free magnetic layer 37c. Therefore, the magnetized direction (opposed to the X-direction) of the second free magnetic layer 37a can be prevented from being disturbed by the magnetostatic field generated from the hard bias layers 61 in the X-direction.

Also, in the magnetoresistive sensor of FIG. 10, assuming that the distance G1s is between the upper shield layer 45 and the lower shield layer 31 in areas S1, S1, which overlaps only lowermost ones of the lowermost electrode layers (first electrode layers 63, 63) and the second electrode layers 64, 64, but do not overlap the insulating layers 50, 50, and the distance G1c is between the upper shield layer 45 and the lower shield layer 31 at a position in alignment with the center C of the multilayered film T2, a difference in value between G1s and G1c is set to be not larger than a predetermined value such that an effective track width E-Tw of the magnetoresistive sensor has a value equal to or below 0.17 $\mu$m. The effective track width E-Tw is measured by, e.g., the full-track profile method or the micro-track profile method.

More specifically, values of G1s and G1c are preferably set to satisfy the range of G1c−20 nm≦G1s≦G1c+90 nm. More preferably, values of G1s and G1c are set to satisfy the range of G1c−20 nm≦G1s≦G1c+70 nm. Even more preferably, values of G1s and G1c are set to satisfy the range of G1c−20 nm≦G1s≦G1c+30 nm.

Stated otherwise, values of G1s and G1c are preferably set to satisfy the range of 0.67≦G1s/G1c≦2.50. More preferably, values of G1s and G1c are set to satisfy the range of 0.67≦G1s/G1c≦2.17. Even more preferably, values of G1s and G1c are set to satisfy the range of 0.67≦G1s/G1c≦1.50.

In the tenth embodiment shown in FIG. 10, as with the above-described embodiments, by setting the difference in value between G1s and G1c to be not larger than the predetermined value, it is possible to suppress an increase in the distance between the upper shield layer 45 and the lower shield layer 31 near the multilayered film T2 on both sides thereof, and to hence reduce the effective track width E-Tw.

Further, in this tenth embodiment, the electrode portion L is formed as a thin single layer constituted only by the first electrode layer or the hard bias layer near the multilayered film T2, and the film thickness of the electrode portion L in an area away from the multilayered film T2 is increased by forming the second electrode layer on the first electrode layer or the hard bias layer.

Consequently, the direct-current resistance value of the magnetoresistive sensor can be reduced while keeping the distance small between the upper shield layer 45 and the lower shield layer 31 near the multilayered film T2 on both sides thereof.

Also, since the electrode portion L (first electrode layer 63 or hard bias layer 61) is formed as a thin layer near the multilayered film T2, the step (level difference) D formed by a lateral slope 63a of the electrode portion L relative to the surface of the multilayered film T2 can be reduced. Therefore, even when the film thickness of the upper gap layer 44 is reduced, the upper gap layer 44 can be adequately formed on the step D. An electrical short-circuit between the upper shield layer 45 and the electrode portion L can thus be prevented with high reliability.

Figure 11:
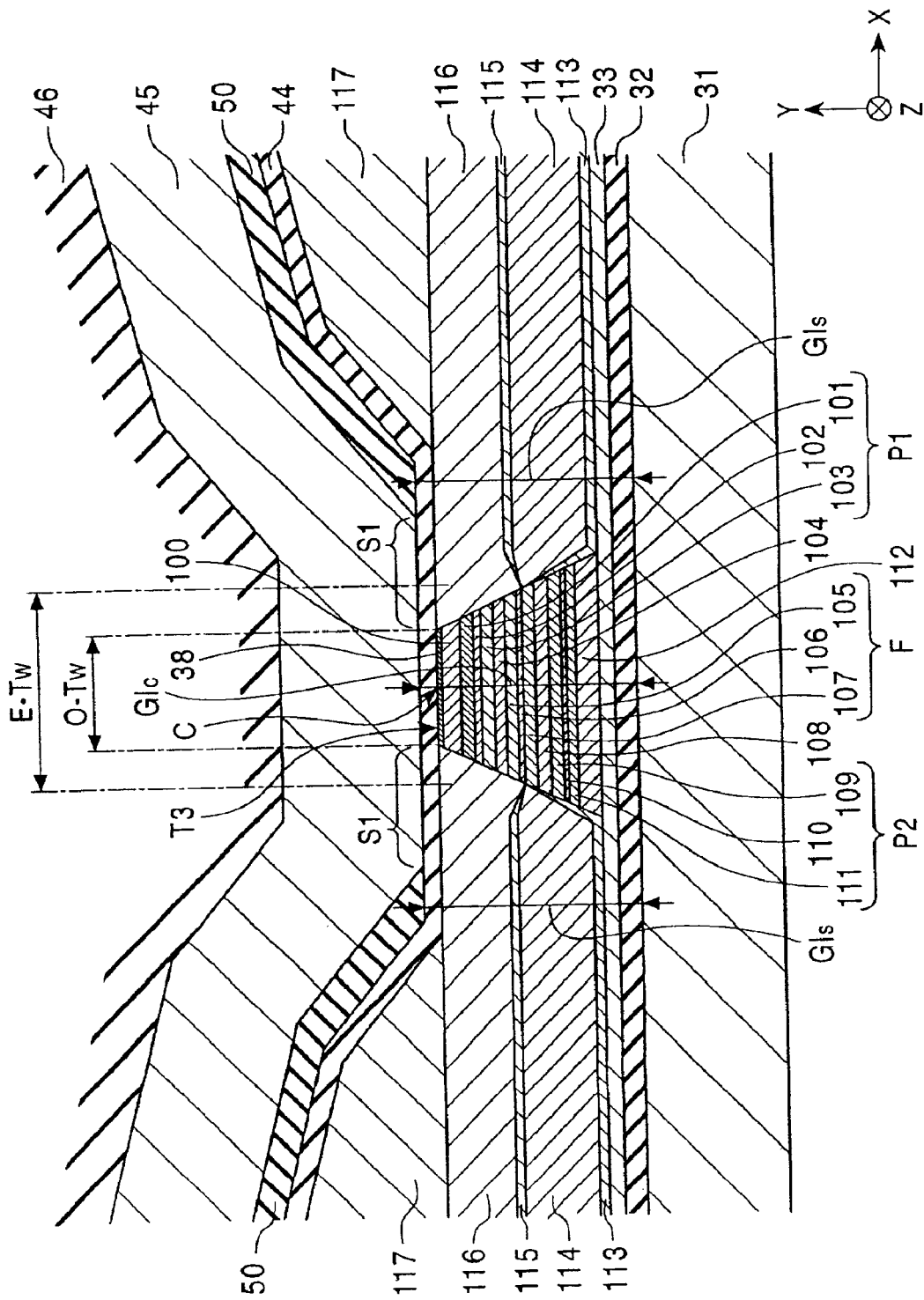
FIG. 11 is a sectional view of a magnetoresistive sensor according to an eleventh embodiment of the present invention, looking from the side facing a recording medium.

FIG. 11 is a sectional view of a magnetoresistive sensor according to an eleventh embodiment of the present invention looking from the side facing a recording medium.

A spin-valve type thin-film magnetoresistive sensor of this eleventh embodiment is the so-called dual-spin-valve type thin-film magnetoresistive sensor in which first and second free magnetic layers 105, 107, nonmagnetic electrically conductive layers 104, 108, first and third pinned magnetic layer 103, 109, nonmagnetic material layers 102, 110, second and fourth pinned magnetic layers 101, 111, and antiferromagnetic layers 100, 112 are successively formed on upper and lower sides of a nonmagnetic material layer 106 at the center, respectively. The dual-spin-valve type thin-film magnetoresistive sensor of this eleventh embodiment is able to produce a higher reproduction output than that produced by any of the spin-valve type thin-film magnetoresistive sensors (called single-spin-valve type thin-film magnetoresistive sensors) shown in FIGS. 1 to 10. In addition, an underlying layer 33 serves as a layer formed at the lowermost side, and a protective barrier layer 38 serves as a layer formed at the uppermost side. A stack including from the underlying layer 33 to the protective barrier layer 38 constitutes a multilayered film T3.

In this eleventh embodiment, the antiferromagnetic layers 100, 112 are each formed of a Pt—Mn (platinum-manganese) alloy. Instead of the Pt—Mn alloy, an X—Mn alloy (where X represents one or more elements selected from the group consisting of Pd, Ir, Rh and Ru), or a Pt—Mn—X' alloy (where X' represents one or more elements selected from the group consisting of Pd, Ir, Rh, Ru, Au and Ag) may also be used.

The first free magnetic layer 105, the second free magnetic layer 107, the first pinned magnetic layer 103, the second pinned magnetic layer 101, the third pinned magnetic layer 109, and the fourth pinned magnetic layer 111 are each formed of, e.g., a Ni—Fe (nickel-iron) alloy, Co (cobalt), a Co—Fe (cobalt-iron) alloy, or a Co—Fe—Ni alloy. The nonmagnetic electrically conductive layers 104, 108 are each formed of a nonmagnetic electrically conductive material having low electrical resistance, such as Cu (copper).

Bias underlying layers 113, 113, each of which are formed of, e.g., Cr and serves as a buffer film and an alignment film, are formed on the underlying layer 33, and are extended to cover respective opposite lateral surfaces of the antiferromagnetic layer 112, the second pinned magnetic layer 111, the nonmagnetic material layer 110, the first pinned magnetic layer 109, and the nonmagnetic electrically conductive layer 108. The formation of the bias underlying layers 113, 113 contributes to an increase in the bias magnetic field generated by hard bias layers 114, 114 (described below).

The hard bias layers 114, 114 of a Co—Pt (cobalt-platinum) alloy or a Co—Cr—Pt (cobalt-chromium-platinum) alloy, for example, are formed on the bias underlying layers 113, 113.

Intermediate layers 115, 115 of a nonmagnetic material, such as Ta, are formed on the hard bias layers 114, 114, and first electrode layers 116, 116 of, for example, Cr, Au, Ta, W, Rh, Ir, Ru or Cu, are formed on the intermediate layers 115, 115.

The first electrode layers 116, 116 are constituted as a pair of electrodes formed in areas on both sides of the multilayered film T3 with a predetermined spacing therebetween in the track-width direction. Second electrode layers 117, 117 of, for example, Cr, Au, Cu, Ta, Rh, Ir, Ru or W, are formed on the first electrode layers 116, 116. The second electrode layers 117, 117 constitute a pair of electrodes having a spacing therebetween in the track-width direction, which is set to be larger than the spacing between the first electrode layers 116, 116.

An upper gap layer 44 is formed on a surface of the multilayered film T3, surfaces of the first electrode layers 116, 116, and surfaces of the second electrode layers 117, 117. An upper shield layer 45 is formed on the upper gap layer 44. The upper shield layer 45 is covered with a protective barrier layer 46 of an inorganic insulating material.

Further, in FIG. 11, the first pinned magnetic layer 103 and the second pinned magnetic layer 101 having magnetic moments different in magnitude from each other are stacked with the nonmagnetic material layer 102 interposed between them, and the resultant stack functions as one pinned magnetic layer P1. Likewise, the third pinned magnetic layer 109 and the fourth pinned magnetic layer 111 having magnetic moments different in magnitude from each other are stacked with the nonmagnetic material layer 110 interposed between them, and the resultant stack functions as one pinned magnetic layer P2.

The first pinned magnetic layer 103 and the second pinned magnetic layer 101 are put into a ferri-magnetic state in which their magnetized directions are 180°-opposed and antiparallel to each other. Hence, the first pinned magnetic layer 103 and the second pinned magnetic layer 101 mutually interact so as to keep the magnetized direction of the counterpart pinned. As a whole, therefore, the magnetized direction of the pinned magnetic layer P1 can be positively pinned in a certain direction.

In the embodiment of FIG. 11, the magnetic moments of the first pinned magnetic layer 103 and the second pinned magnetic layer 101 are made different in magnitude from each other by forming these layers with the same material but in different thicknesses.

Similarly, the third pinned magnetic layer 109 and the fourth pinned magnetic layer 111 are put into a ferri-magnetic state in which their magnetized directions are 180°-opposed and antiparallel to each other. Hence, the third pinned magnetic layer 109 and the fourth pinned magnetic layer 111 mutually interact so as to keep the magnetized direction of the counterpart pinned.

The nonmagnetic material layers 102, 110 are each formed of one element selected from the group consisting of Ru, Rh, Ir, Cr, Re and Cu, or an alloy of two or more elements selected from among them.

The second pinned magnetic layer 101 and the fourth pinned magnetic layer 111 are formed in contact with the antiferromagnetic layers 100 and 112, respectively. With annealing carried out under a magnetic field, an exchange anisotropic magnetic field is generated by exchange coupling at the interface between the second pinned magnetic layer 101 and the antiferromagnetic layer 100, and at the interface between the fourth pinned magnetic layer 111 and the antiferromagnetic layer 112.

Therefore, the magnetized direction of the second pinned magnetic layer 101 is pinned in the Z-direction (as shown in the figure). When the magnetized direction of the second pinned magnetic layer 101 is pinned in the Y-direction, the magnetized direction of the first pinned magnetic layer 103, which is positioned in an opposite relation to the second pinned magnetic layer 101 with the nonmagnetic material layer 102 interposed therebetween, is pinned antiparallel to the magnetized direction of the second pinned magnetic layer 101. Additionally, the direction of the resultant magnetic moment given by the sum of the magnetic moment of the second pinned magnetic layer 101 and the magnetic moment of the first pinned magnetic layer 103 defines the magnetized direction of the pinned magnetic layer P1.

When the magnetized direction of the second pinned magnetic layer 101 is pinned in the Z-direction, the magnetized direction of the fourth pinned magnetic layer 111 is preferably pinned in a direction antiparallel to the Z-direction. At this time, the magnetized direction of the third pinned magnetic layer 109, which is positioned in an opposite relation to the fourth pinned magnetic layer 111 with the nonmagnetic material layer 110 interposed therebetween, is pinned antiparallel to the magnetized direction of the fourth pinned magnetic layer 111, i.e., in the Z-direction. Additionally, the direction of the resultant magnetic moment given by the sum of the magnetic moment of the fourth pinned magnetic layer 111 and the magnetic moment of the third pinned magnetic layer 109 defines the magnetized direction of the pinned magnetic layer P2.

Thus, the magnetized directions of the first pinned magnetic layer 103 and the third pinned magnetic layer 109, which are position in an opposite relation to each other with the first free magnetic layer 105, the nonmagnetic material layer 106 and the second free magnetic layer 107 interposed between them, are 180°-opposed and antiparallel to each other.

In the embodiment of FIG. 11, as described below, a free magnetic layer F is of a structure comprising the first free magnetic layer 105 and the second free magnetic layer 107, which are stacked with the nonmagnetic material layer 106 interposed therebetween. Stated otherwise, the free magnetic layer F is in a ferri-magnetic state in which the magnetized directions of the first free magnetic layer 105 and the second free magnetic layer 107 are antiparallel to each other.

Under the influence of an external magnetic field, the first free magnetic layer 105 and the second free magnetic layer 107 change their magnetized directions while holding the ferri-magnetic state. On that occasion, when the magnetized directions of the first pinned magnetic layer 103 and the third pinned magnetic layer 109 are 180°-opposed and antiparallel to each other, a resistance change rate on the upper side of the free magnetic layer F has the same phase as that on the lower side of the free magnetic layer F.

Furthermore, the magnetized direction of the pinned magnetic layer P1 is preferably antiparallel to the magnetized direction of the pinned magnetic layer P2.

For example, by setting the magnetic moment of the second pinned magnetic layer 101, of which the magnetized direction is pinned in the Z-direction, to be larger than the magnetic moment of the first pinned magnetic layer 103, the magnetized direction of the pinned magnetic layer P1 is set in the Z-direction. On the other hand, by setting the magnetic moment of the third pinned magnetic layer 109, of which the magnetized direction is pinned in the Z-direction, to be smaller than the magnetic moment of the fourth pinned magnetic layer 111, the magnetized direction of the pinned magnetic layer P2 is set antiparallel to the Z-direction.

With this arrangement, the direction of a magnetic field, which is generated by a sensing electric current when the sensing electric current is supplied to flow opposite to the X-direction, matches with the magnetized direction of the pinned magnetic layer P1 and the magnetized direction of the pinned magnetic layer P2. As a result, the ferri-magnetic state between the first pinned magnetic layer 103 and the second pinned magnetic layer 101, and the ferri-magnetic state between the third pinned magnetic layer 109 and the fourth pinned magnetic layer 111 are both stabilized.

Moreover, the first free magnetic layer 105 and the second free magnetic layer 107 are formed to have magnetic moments different in magnitude from each other. As with the pinned magnetic layers, the magnetic moments of the first free magnetic layer 105 and the second free magnetic layer 107 are made different in magnitude from each other by forming those layers with the same material but in different thicknesses.

The nonmagnetic material layers 102, 106 and 110 are each formed of one element selected from the group consisting of Ru, Rh, Ir, Cr, Re and Cu, or an alloy of two or more elements selected from among them.

In the embodiment of FIG. 11, the first free magnetic layer 105 and the second free magnetic layer 107 are stacked with the nonmagnetic material layer 106 interposed between them, and the resultant stack functions as one free magnetic layer F.

The first free magnetic layer 105 and the second free magnetic layer 107 are in the ferri-magnetic state in which their magnetized directions are antiparallel to each other. There hence is obtained an effect equivalent to that resulting from reducing a film thickness of the free magnetic layer F. Since that effect reduces the effective magnetic moment in the entirety of the free magnetic layer F per unit area, the magnetization of the free magnetic layer F becomes more apt to vary and the magnetic-field detecting sensitivity of the magnetoresistive sensor is improved.

The direction of resultant magnetic moment given by the sum of the magnetic moment of the first free magnetic layer 105 and the magnetic moment of the second free magnetic layer 107 defines the magnetized direction of the free magnetic layer F.

The hard bias layers 114, 114 are magnetized in the X-direction (track-width direction) as shown. With the bias magnetic field generated by the hard bias layers 114, 114 in the X-direction, the magnetized direction of the free magnetic layer F is aligned in the X-direction.

In a sensitive zone similar to the zone E described above in connection with FIG. 8, the magnetization of the pinned magnetic layers P1, P2 is properly pinned in the Z-direction as shown, or in a direction opposed to the Z-direction, and the magnetization of the free magnetic layer F is properly aligned in the X-direction as shown, so that the pinned magnetic layers P1, P2 and the free magnetic layer F are perpendicular to each other in their magnetized directions. Then, the magnetized direction of the free magnetic layer F is varied with high sensitivity depending on an external magnetic field applied from a recording medium, and the value of electrical resistance is changed depending on the relationship between the variation in the magnetized direction of the free magnetic layer F and the pinned magnetized directions of the pinned magnetic layers P1, P2. A leakage magnetic field from the recording medium is detected in accordance with the voltage change caused by a change in the value of electrical resistance. In this respect, the change in the value of electrical resistance (i.e., output) is directly affected by a relative angle formed between the magnetized direction of the first pinned magnetic layer 103 and the magnetized direction of the first free magnetic layer 105, and a relative angle formed between the magnetized direction of the third pinned magnetic layer 109 and the magnetized direction of the second free magnetic layer 107. Those relative angles are each preferably right angles in a state in which a sensing electric current is supplied and a signal magnetic field is not applied.

The hard bias layers 114 are just required to align the magnetized direction of one of the first free magnetic layer 105 and the second free magnetic layer 107, which constitute the free magnetic layer F. In FIG. 11, the hard bias layers 114 function to align the magnetized direction of only the second free magnetic layer 107. With the magnetized direction of the second free magnetic layer 107 aligned in a certain direction, the ferri-magnetic state is established such that the magnetized direction of the first free magnetic layer 105 is made antiparallel to the magnetized direction of the second free magnetic layer 107. As a result, the magnetized direction in the entirety of the free magnetic layer F is aligned in a specific direction.

In this eleventh embodiment, the hard bias layers 114 apply a magnetostatic field in the X-direction primarily to the second free magnetic layer 107. Therefore, the magnetized direction (opposed to the X-direction) of the first free magnetic layer 105 can be prevented from being disturbed by the magnetostatic field generated from the hard bias layers 114 in the X-direction.

Also, in the magnetoresistive sensor of FIG. 11, assuming that the distance G1$s$ is between the upper shield layer 45 and the lower shield layer 31 in areas S1, S1, which overlap only the lowermost ones of the lowermost electrode layers (first electrode layers 116, 116) and the second electrode layers 117, 117, but do not overlap the insulating layers 50, 50, and the distance G1$c$ is between the upper shield layer 45 and the lower shield layer 31 at a position in alignment with the center C of the multilayered film T3, a difference in value between G1$s$ and G1$c$ is set to be not larger than a predetermined value such that an effective track width E-Tw of the magnetoresistive sensor has a value equal to or below 0.17 $\mu$m. The effective track width E-Tw is measured by, e.g., the full-track profile method or the micro-track profile method.

More specifically, values of G1$s$ and G1$c$ are preferably set to satisfy the range of G1$c$−20 nm$\leq$G1$s$$\leq$G1$c$+90 nm. More preferably, values of G1$s$ and G1$c$ are set to satisfy the range of G1$c$−20 nm$\leq$G1$s$$\leq$G1$c$+70 nm. Even more preferably, values of G1$s$ and G1$c$ are set to satisfy the range of G1$c$−20 nm$\leq$G1$s$$\leq$G1$c$+30 nm.

Stated otherwise, values of G1$s$ and G1$c$ are preferably set to satisfy the range of 0.67$\leq$G1$s$/G1$c$$\leq$2.50. More preferably, values of G1$s$ and G1$c$ are set to satisfy the range of 0.67$\leq$G1$s$/G1$c$$\leq$2.17. Even more preferably, values of G1$s$ and G1$c$ are set to satisfy the range of 0.67$\leq$G1$s$/G1$c$$\leq$1.50.

In the eleventh embodiment shown in FIG. 11, as with the above-described embodiments, by setting the difference in value between G1$s$ and G1$c$ to be not larger than the predetermined value, it is possible to suppress an increase in the distance between the upper shield layer 45 and the lower shield layer 31 near the multilayered film T3 on both sides thereof, and to hence reduce the effective track width E-Tw.

Further, in this eleventh embodiment, the electrode portion L is formed as a thin single layer constituted only by the first electrode layer or the hard bias layer near the multilayered film T3, and the film thickness of the electrode portion L in an area away from the multilayered film T3 is increased by forming the second electrode layer on the first electrode layer or the hard bias layer.

Consequently, the direct-current resistance value of the magnetoresistive sensor can be reduced while keeping the distance small between the upper shield layer 45 and the lower shield layer 31 near the multilayered film T3 on both sides thereof.

While, in the magnetoresistive sensors shown in FIGS. 1 to 11, the electrode portion L is of a multilayered structure comprising two electrode layers, it may be of a multilayered structure comprising three or more electrode layers.

Figure 12:
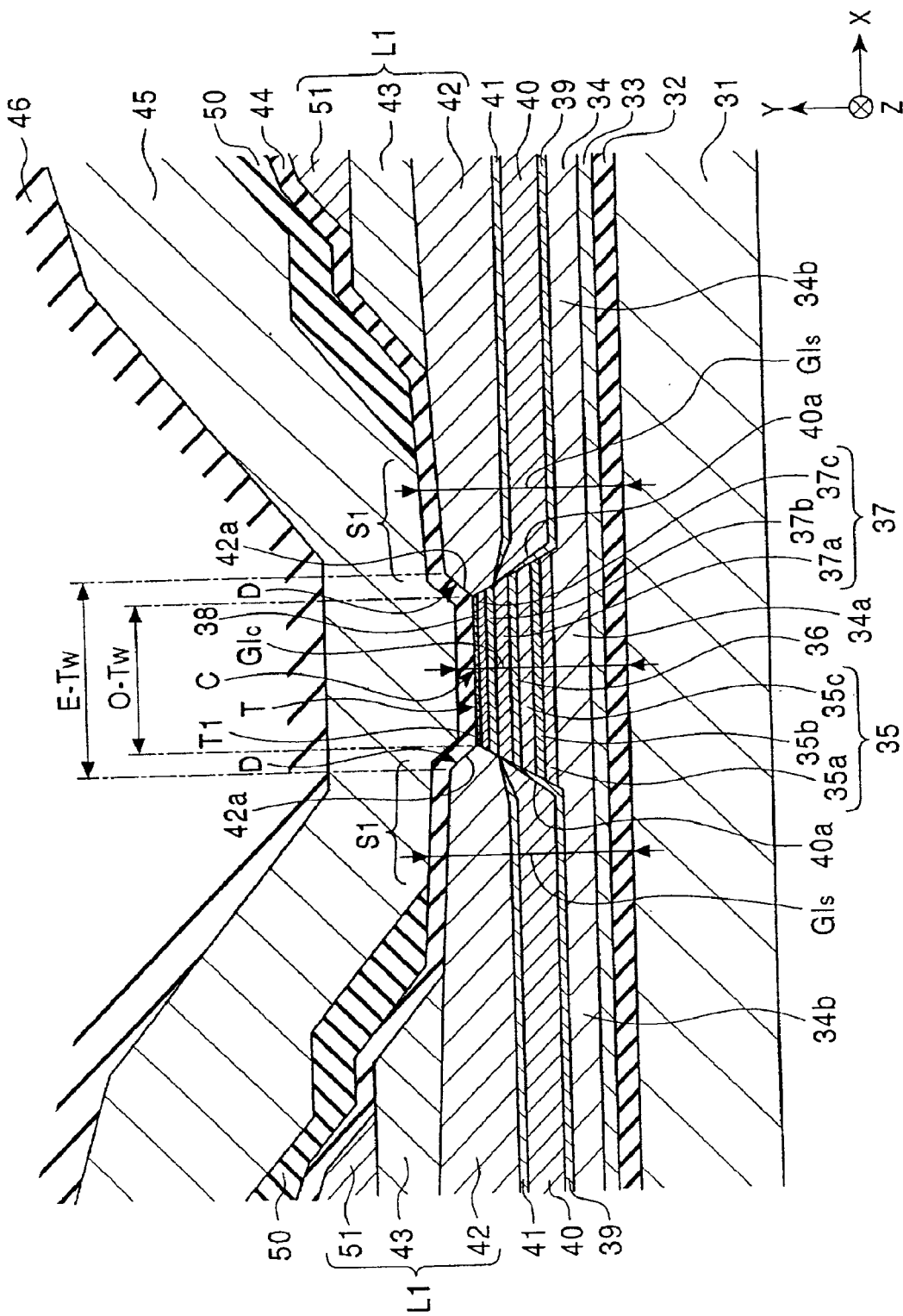
FIG. 12 is a sectional view of a magnetoresistive sensor according to a twelfth embodiment of the present invention, looking from the side facing a recording medium.

FIG. 12 is a sectional view of a magnetoresistive sensor according to a twelfth embodiment of the present invention, looking from the side facing a recording medium.

The magnetoresistive sensor of FIG. 12 differs from that of FIG. 1 only in that an electrode portion L1 is of a multilayered structure comprising three electrode layers 42, 43 and 51.

The second electrode layers 43, 43 constitute a pair of electrodes having a spacing therebetween in the track-width direction, which is set to be larger than the spacing between the first electrode layers 42, 42, and the third electrode layers 51, 51 constitute a pair of electrodes having a spacing therebetween in the track-width direction, which is set to be larger than the spacing between the second electrode layers 43, 43.

Also, in the magnetoresistive sensor of FIG. 12, assuming that the distance G1$s$ is between the upper shield layer 45 and the lower shield layer 31 in areas S1, S1, which overlap only the lowermost ones of the lowermost electrode layers (first electrode layers 42, 42), the second electrode layers 43, 43 and the third electrode layers 51, 51, but do not overlap the insulating layers 50, 50, and the distance is between the upper shield layer 45 and the lower shield layer 31 at a position in alignment with the center C of the multilayered film T, a difference in value between G1$s$ and G1$c$ is set to be not larger than a predetermined value such that an effective track width E-Tw of the magnetoresistive sensor has a value equal to or below 0.17 $\mu$m. The effective track width E-Tw is measured by, e.g., the full-track profile method or the micro-track profile method.

More specifically, values of G$ls$ and G1$c$ are preferably set to satisfy the range of G1$c$−20 nm$\leq$G1$s$$\leq$G1$c$+90 nm. More preferably, values of G1$s$ and G1$c$ are set to satisfy the range of G1$c$−20 nm$\leq$G1$s$$\leq$G1$c$+70 nm. Even more preferably, values of G1$s$ and G1$c$ are set to satisfy the range of G1$c$−20 nm$\leq$G1$s$$\leq$G1$c$+30 nm.

Stated otherwise, values of G1$s$ and G1$c$ are preferably set to satisfy the range of 0.67$\leq$G1$s$/G1$c$$\leq$2.50. More preferably, values of G1$s$ and G1$c$ are set to satisfy the range of 0.67$\leq$G1$s$/G1$c$$\leq$2.17. Even more preferably, values of G1$s$ and G1$c$ are set to satisfy the range of 0.67$\leq$G1$s$/G1$c$$\leq$1.50.

In the twelfth embodiment shown in FIG. 12, as with the above-described embodiments, by setting the difference in value between G1s and G1c to be not larger than the predetermined value, it is possible to suppress an increase in the distance between the upper shield layer 45 and the lower shield layer 31 near the multilayered film T on both sides thereof, and to hence reduce the effective track width E-Tw.

Further, in this twelfth embodiment, the electrode portion L1 is formed as a thin single layer constituted only by the first electrode layer 42 near the multilayered film T, and the film thickness of the electrode portion L in an area away from the multilayered film T is increased by forming the second electrode layer 43 and the third electrode layer 51 on the first electrode layer 42.

Consequently, the direct-current resistance value of the magnetoresistive sensor can be reduced while keeping the distance small between the upper shield layer 45 and the lower shield layer 31 near the multilayered film T on both sides thereof.

Also, since the first electrode layer 42 is formed as a thin layer near the multilayered film T, the step (level difference) D formed by a lateral slope 42a of the first electrode layer 42 relative to the surface of the multilayered film T can be reduced. Therefore, even when the film thickness of the upper gap layer 44 is reduced, the upper gap layer 44 can be adequately formed on the step D. An electrical short-circuit between the upper shield layer 45 and the electrode portion L can thus be prevented with high reliability.

Additionally, the electrode layers of the multilayered structure are preferably formed such that an angle formed between a plane parallel to the surface of the multilayered film and a plane tangential to the front edge of each electrode layer becomes smaller as the electrode layer is positioned at a higher level, and as the electrode layer positioned at a higher level has a larger film thickness.

Moreover, the free magnetic layer 37, F and the pinned magnetic layer 35, P1, P2 may each be formed as a single magnetic material layer or a two-layered magnetic material layer (such as CoFe/NiFe).

Figure 13:
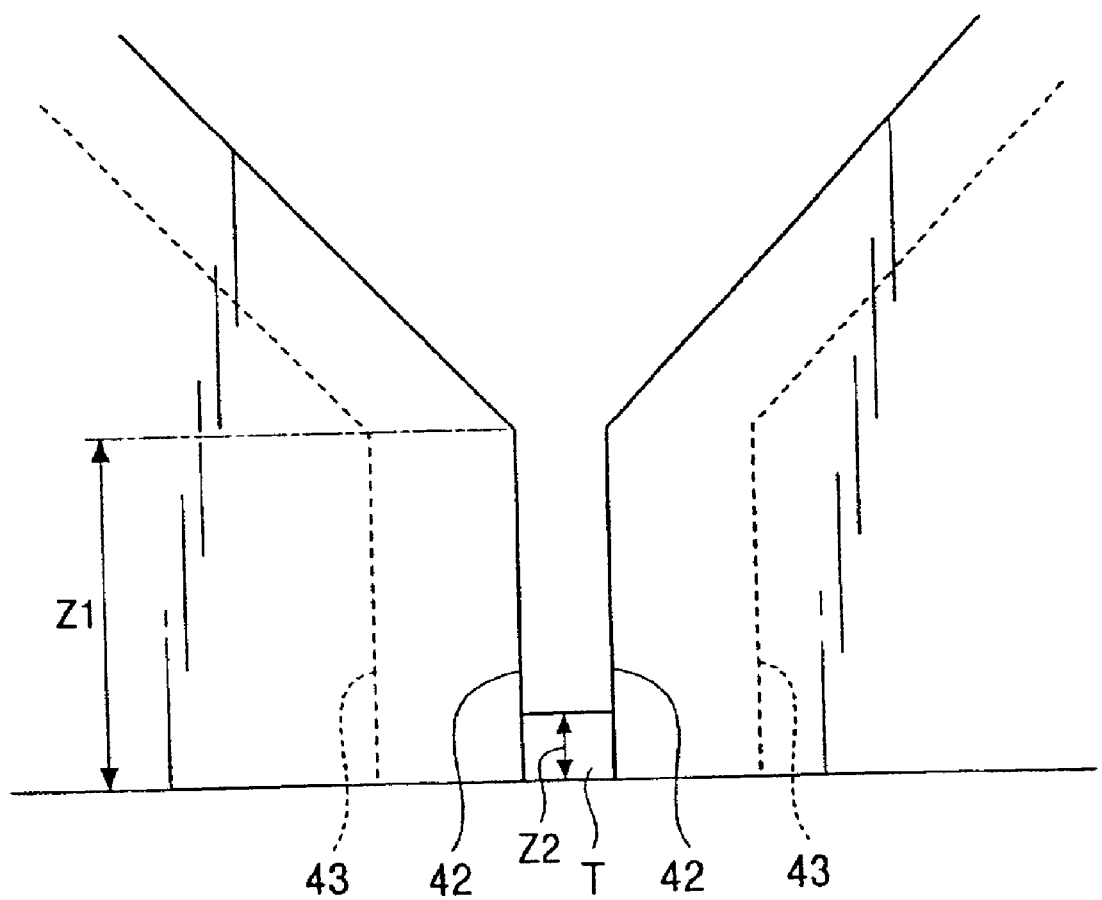
FIG. 13 is a top plan view of a multilayered film T, first electrode layers 42, 42 and second electrode layers 43, 43 of the magnetoresistive sensor shown in FIG. 1, looking from above in FIG. 1.

FIG. 13 is a top plan view of the multilayered film T, the first electrode layers 42, 42 and the second electrode layers 43, 43 of the magnetoresistive sensor shown in FIG. 1, looking from above in FIG. 1.

As shown in FIG. 13, the first electrode layers 42, 42 serving as the lowermost ones of multilayered electrode layers have a length Z1 in the height direction, which is larger than a length Z2 of the multilayered film T in the height direction. With such a structure, the direct-current resistance value of the magnetoresistive sensor can be reduced.

In the present invention, the lowermost electrode layers (first electrode layers 42, 63, 117 or hard bias layers 40) electrically connected to the multilayered film T, T2 or T3 are preferably each formed of a hard material, such as W, Ta Rh, Ir or Ru, so that smearing is less likely to occur during the step of polishing the surface of a magnetoresistive sensor positioned to face a recording medium for the adjustment of the direct-current resistance value. Also, the electrode layers (second and third electrode layers) other than the lowermost ones are each preferably formed of a material having small specific resistance, such as Cr, Cu, Au or Ta.

The method for manufacturing magnetoresistive sensor shown in FIG. 2 will be described below.

Figure 14:
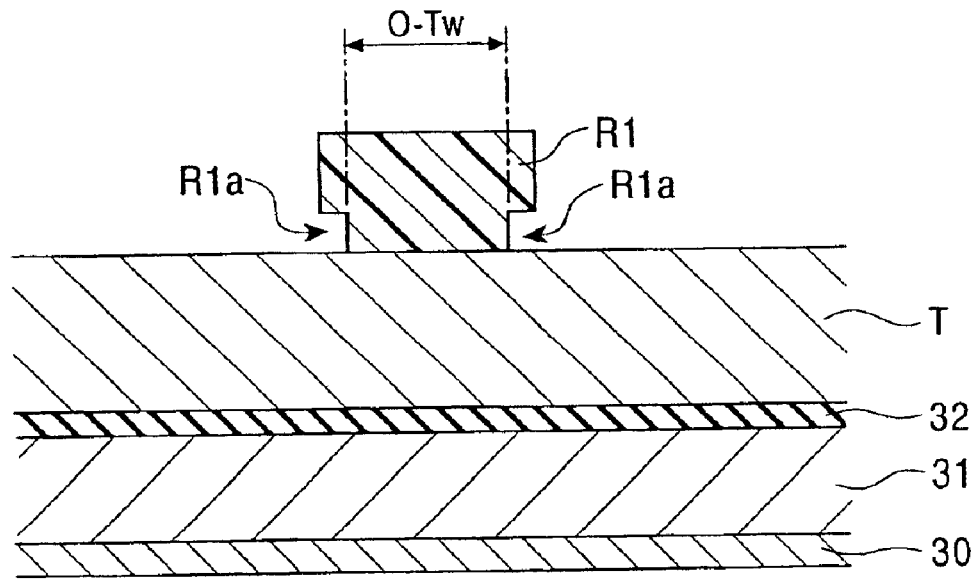
FIG. 14 is a sectional view showing one step of an embodiment of a method for manufacturing the magnetoresistive sensor of the present invention.

First, as shown in FIG. 14, a lower shield layer 31 and a lower gap layer 32 are formed successively. The lower shield layer 31 is formed using a magnetic material, such as NiFe, and the lower gap layer 32 is formed using an insulating material, such as $Al_2O_3$ or $SiO_2$. The lower shield layer 31 is formed on a substrate 30 with an underlying layer (not shown) made of an insulating material, such as alumina, interposed between them.

Then, a multilayered film T is formed as shown in FIG. 2 by successively forming, on the lower gap layer 32, an underlying layer 33, an antiferromagnetic layer 34, a synthetic ferri-pinned type pinned magnetic layer 35 made up of a first pinned magnetic layer 35a, a nonmagnetic intermediate layer 35b and a second pinned magnetic layer 35c, a nonmagnetic material layer 36, a synthetic ferri-free type free magnetic layer 37 made up of a second free magnetic layer 37a, a nonmagnetic intermediate layer 37b and a first free magnetic layer 37c, and a protective barrier layer 38 in that order.

Note that the multilayered film T may be replaced with the multilayered film T2 of the single-spin-valve type thin-film magnetoresistive sensor shown in FIG. 10, or the multilayered film T3 of the dual-spin-valve type thin-film magnetoresistive sensor shown in FIG. 11.

The antiferromagnetic layer constituting one layer of the multilayered film T, T2 or T3 is preferably formed of a PtMn alloy. Alternatively, the antiferromagnetic layer may be formed of an X—Mn alloy (where X represents one or more elements selected from the group consisting of Pd, Ir, Rh and Ru), or a Pt—Mn—X' alloy (where X' represents one or more elements selected from the group consisting of Pd, Ir, Rh, Ru, Au and Ag). When any of these alloys is used to form the antiferromagnetic layer, the antiferromagnetic layer must be subjected to heat treatment to produce an exchange coupling magnetic field at the interface between itself and the pinned magnetic layer.

Then, a lift-off resist layer R1 is patterned on the multilayered film T so as to cover an area corresponding to an optical track width O-Tw of the magnetoresistive sensor to be manufactured.

As shown in FIG. 14, undercuts R1a, R1a are formed in the underside of the resist layer R1 at opposite lateral ends.

Figure 15:
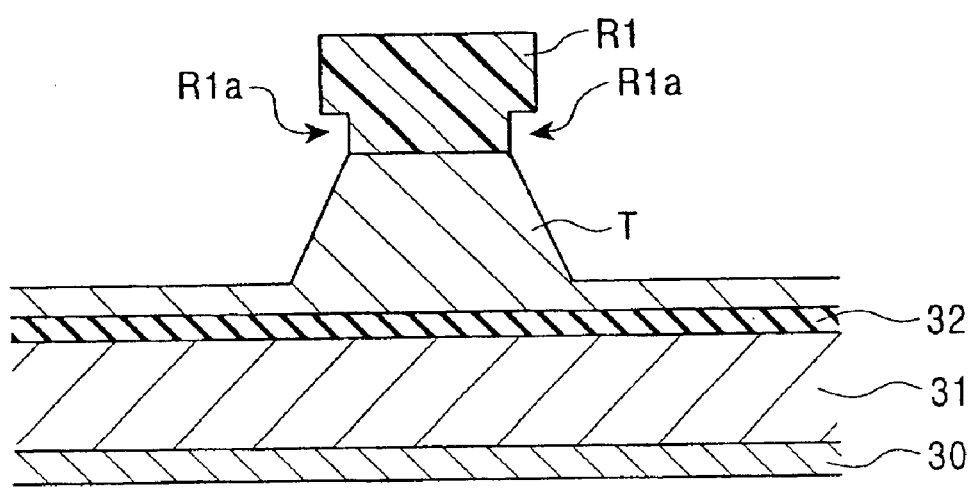
FIG. 15 is a sectional view showing another step of the embodiment of the method for manufacturing the magnetoresistive sensor of the present invention.

Then, in a step shown in FIG. 15, the multilayered film T is etched in areas on both sides of the resist layer R1. In this step, the etching rate and the etching time are controlled such that laterally extended portions of the antiferromagnetic layer 34 are not etched away, but remain as shown. The antiferromagnetic layer 34 is therefore formed to extend over a long distance in the X-direction. If the laterally extended portions of the antiferromagnetic layer 34 are totally etched away, the magnetoresistive sensor shown in FIG. 6 can be obtained.

Figure 16:
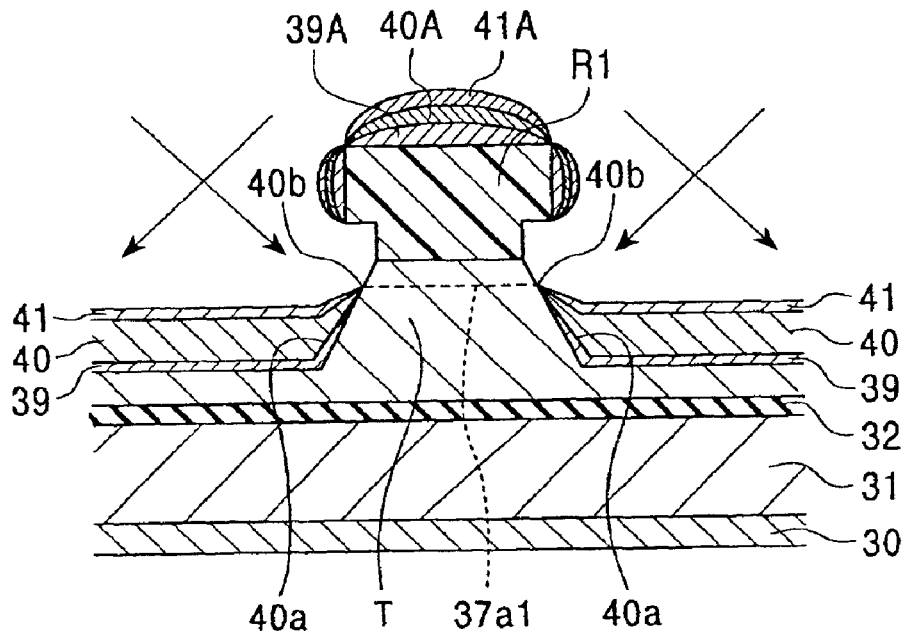
FIG. 16 is a sectional view showing still another step of the embodiment of the method for manufacturing the magnetoresistive sensor of the present invention.

In a step shown in FIG. 16, bias underlying layers 39, 39, hard bias layers 40, 40, and intermediate layers 41, 41 are formed on both sides of the multilayered film T. The bias underlying layers 39, 39 are formed using one or more materials selected from the group consisting of Cr, Ti, Mo or $W_{50}Mo_{50}$, and preferably Cr. The hard bias layers 40, 40 are formed using, e.g., a Co—Pt (cobalt-platinum) alloy or a Co—Cr—Pt (cobalt-chromium-platinum) alloy. The intermediate layers 41, 41 are formed using Ta. In this embodiment, the bias underlying layers 39, 39, the hard bias layers 40, 40, and the intermediate layers 41, 41 are formed by ion sputtering having anisotropy.

Also, in this embodiment, the hard bias layers 40, 40 are such that uppermost ends 40b, 40b of lateral surfaces 40a thereof on the sides facing the multilayered film T are positioned at a level in alignment with an upper surface 37a1 of the second free magnetic layer 37a. In other words, the lateral surface 40a of each hard bias layer 40 facing the multilayered film T is formed so as to extend up to a level confronting a lateral surface of the second free magnetic layer 37a, but not to a level confronting a lateral surface of the first free magnetic layer 37c. Alternatively, as shown in FIG. 7, the lateral surface 40a of the hard bias layer 40 may be extended to cover a lateral surface of the pinned magnetic layer 35, a lateral surface of the nonmagnetic material layer 36, and respective lateral surfaces of the second free magnetic layer 37a, the nonmagnetic intermediate layer 37b and the first free magnetic layer 37c.

The hard bias layers 40 align the magnetized direction of only one of the second free magnetic layer 37a and the first free magnetic layer 37c, which constitute the free magnetic layer 37. With the magnetized direction of the second free magnetic layer 37a aligned in a certain direction, the ferrimagnetic state is established such that the magnetized direction of the first free magnetic layer 37c is made antiparallel to the magnetized direction of the second free magnetic layer 37a. As a result, the magnetized direction in the entirety of the free magnetic layer 37 is aligned in the certain direction.

In this embodiment, the hard bias layers 40 apply a magnetostatic field in the X-direction primarily to the second free magnetic layer 37a. Therefore, the magnetized direction (opposed to the X-direction) of the first free magnetic layer 37c can be prevented from being disturbed by the magnetostatic field generated from the hard bias layers 40 in the X-direction.

Figure 17:
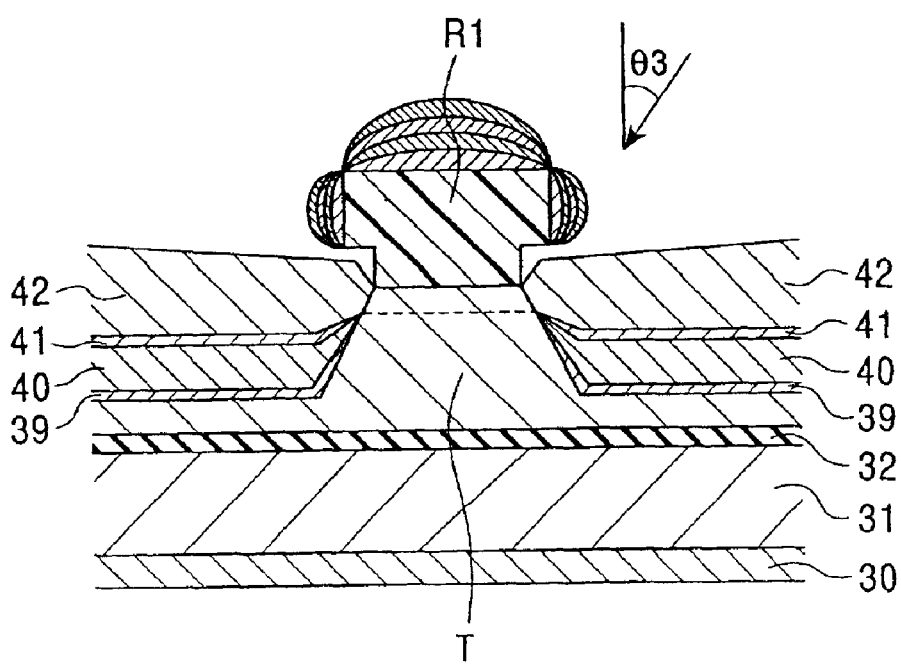
FIG. 17 is a sectional view showing still another step of the embodiment of the method for manufacturing the magnetoresistive sensor of the present invention.

Then, in a step shown in FIG. 17, first electrode layers 42, 42 are formed on the intermediate layers, 41, 41 at a predetermined angle $\theta 3$ with respect to a direction normal to the surface of the substrate 30. The first electrode layers 42, 42 are constituted as a pair of electrodes formed in areas on both sides of the multilayered film T with a predetermined spacing Sp1 left therebetween in the track-width direction.

On that occasion, the first electrode layers 42, 42 may be formed so as to enter the undercuts R1a, R1a, which are provided in the underside of the resist layer R1 formed on the multilayered film T.

When forming the first electrode layers 42, 42, it is preferable, as shown in FIG. 13, that the first electrode layers 42, 42 have a length Z1 in the height direction, which is larger than a length Z2 of the multilayered film T in the height direction.

Figure 18:
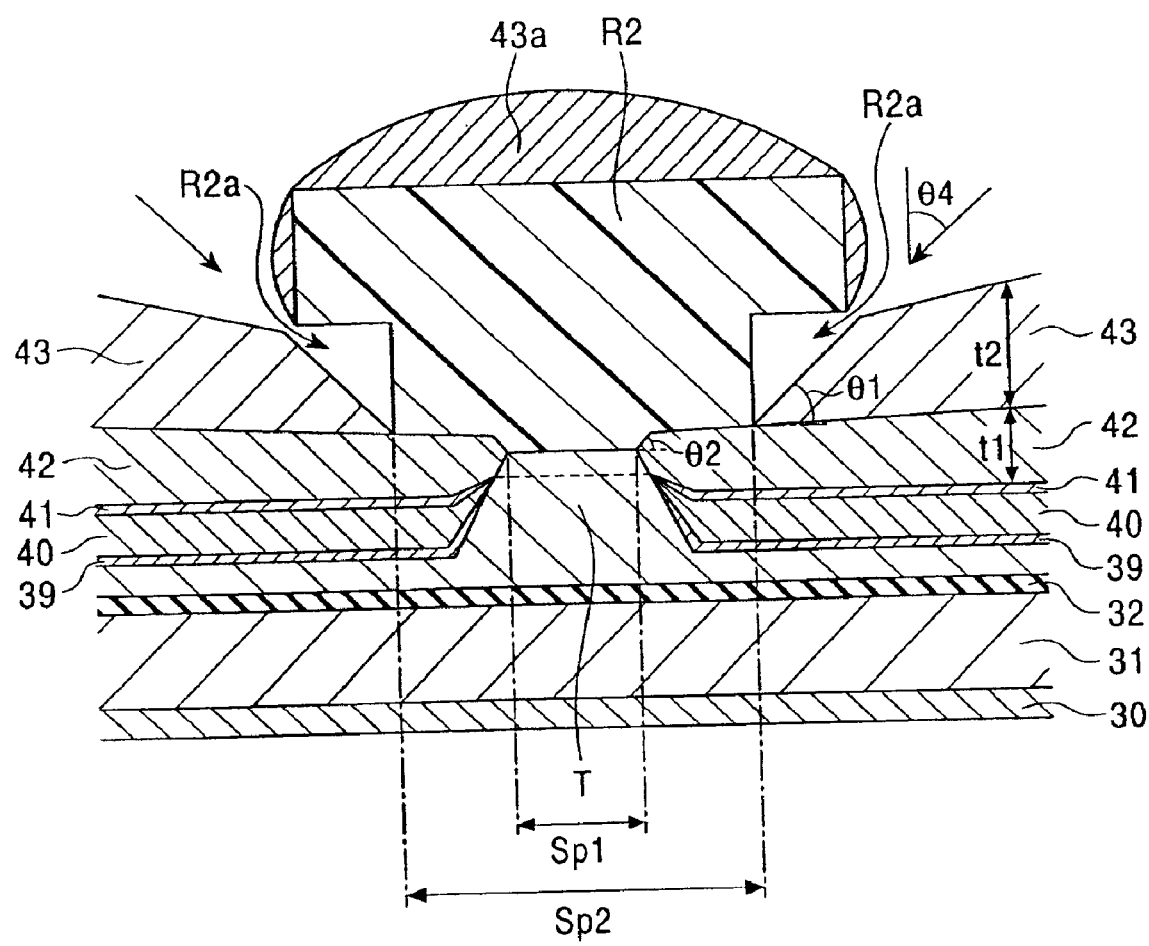
FIG. 18 is a sectional view showing still another step of the embodiment of the method for manufacturing the magnetoresistive sensor of the present invention.

After removing the lift-off resist layer R1 using a resist peeling-off liquid, a lift-off resist layer R2 having undercuts R2a, R2a provided in the underside is formed on the multilayered film T and the first electrode layers 42, as shown in FIG. 18.

Subsequently, second electrode layers 43, 43 are formed on the first electrode layers 42, 42 at a predetermined angle $\theta 4$ with respect to the direction normal to the surface of the substrate 30. By employing the manufacturing method described above, a spacing Sp2 between a pair of electrodes constituted by the second electrode layers 43, 43 in the track-width direction can be made larger than the spacing Sp1 between a pair of electrodes constituted by the first electrode layers 42, 42 in the track-width direction.

On that occasion, the second electrode layers 43, 43 may be formed so as to enter the undercuts R2a, R2a, which are provided in the underside of the resist layer R2.

The first electrode layers 42, 42 and the second electrode layers 43, 43 are formed, by way of example, as follows. A target formed of the same composition as that of the first electrode layers 42, 42 or the second electrode layers 43, 43 is disposed in an oblique relation to the substrate 30, on which the multilayered film T is formed. Then, the first electrode layers 42, 42 or the second electrode layers 43, 43 are formed on the intermediate layers 41, 41 by ion beam sputtering, long-throw sputtering, collimation sputtering, or a combination thereof while moving or rotating the target relative to the substrate 30.

As an alternative, the substrate 30 may be moved or rotated in an oblique relation to the target while holding the target fixed. Additionally, as shown in FIG. 18, a layer 43A having the same composition as that of the second electrode layers 43, 43 is formed on the resist layer R2.

The angle $\theta 4$ at which the second electrode layers 43, 43 are formed is preferably set to be larger than the angle $\theta 3$ at which the first electrode layers 42, 42 are formed. By satisfying the relationship of the film forming angle $\theta 4 >$ the film forming angle $\theta 3$, an angle $\theta 1$ formed between a plane parallel to the surface of the multilayered film T and a plane tangential to the front edge of the second electrode layer 43 can be made smaller than an angle $\theta 2$ formed between the plane parallel to the surface of the multilayered film T and a plane tangential to the front edge of the first electrode layer 42.

Satisfying the relationship of $\theta 1 < \theta 2$ assists in stabilizing the supply of an electric current to the multilayered film T from the first electrode layers 42, 42, which are directly connected to the multilayered film T.

Also, for the purpose of suppressing an increase in the distance between the upper shield layer 45 and the lower shield layer 31 near the multilayered film T on both sides thereof and reducing the direct-current resistance value of the magnetoresistive sensor, a film thickness t2 of the second electrode layer 43 is preferably set to be larger than a film thickness t1 of the first electrode layer 42.

Further, the first electrode layers 42, 42, which are the lowermost electrode layers electrically connected to the multilayered film T, are preferably formed of a hard material such as W, Ta Rh, Ir or Ru, so that smearing is less likely to occur in the step of polishing the surface of the magnetoresistive sensor positioned to face a recording medium for the adjustment of the direct-current resistance value. Also, the second electrode layers 43, 43 are preferably formed of a material having small specific resistance, such as Cr, Cu, Au or Ta.

Figure 19:
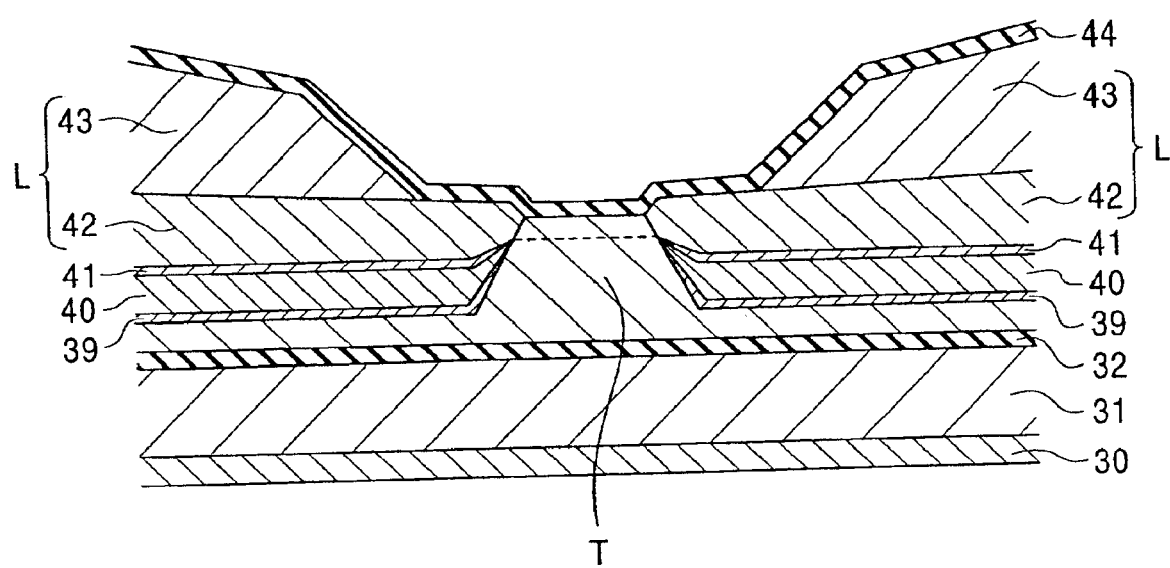
FIG. 19 is a sectional view showing still another step of the embodiment of the method for manufacturing the magnetoresistive sensor of the present invention.

After removing the lift-off resist layer R2 using a resist peeling-off liquid, an upper gap layer 44 is formed on the multilayered film T, the first electrode layers 42, 42 and the second electrode layers 43, 43, as shown in FIG. 19.

Figure 20:
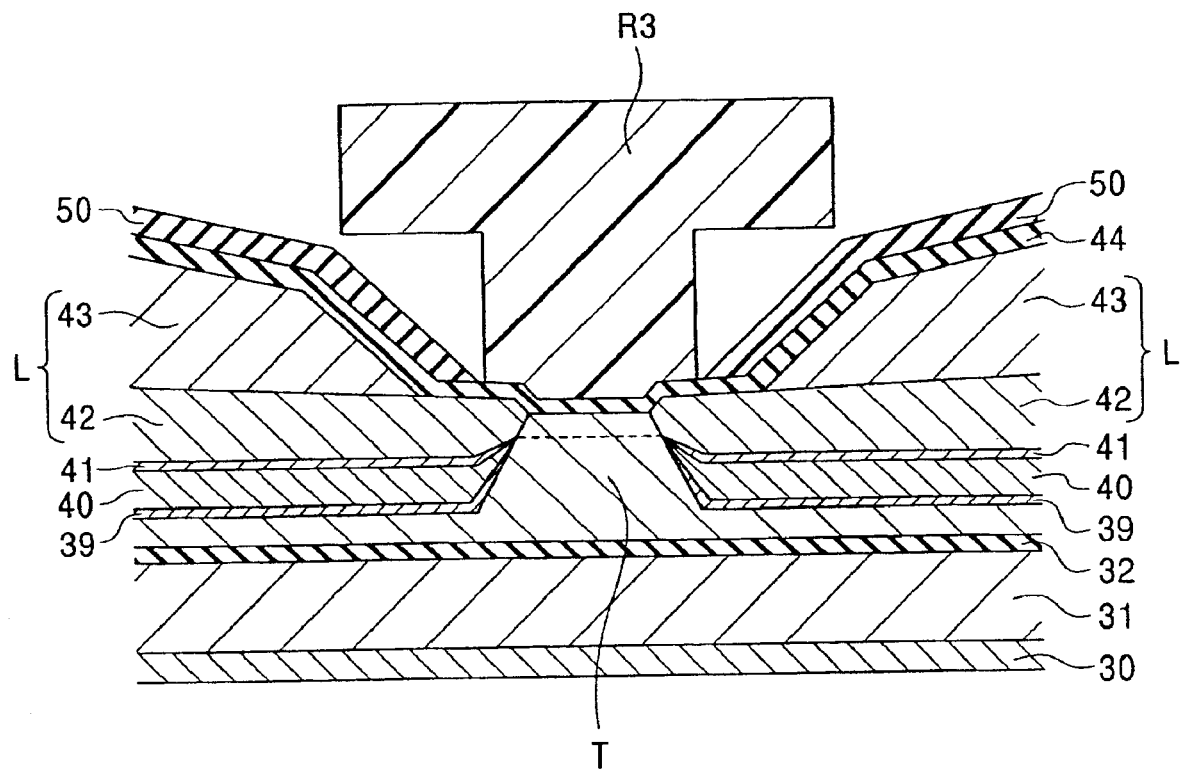
FIG. 20 is a sectional view showing still another step of the embodiment of the method for manufacturing the magnetoresistive sensor of the present invention.

Then, in a step shown in FIG. 20, a lift-off resist layer R3 provided with undercuts is formed in areas overlapping the multilayered film T and parts of the first electrode layers 42, 42 serving as the lowermost electrode layers. Subsequently, insulating layers 50, 50 are formed in an oblique relation to the substrate 30 so as to cover parts of the first electrode layers 42, 42 and the whole of the second electrode layers 43, 43.

Figure 21:
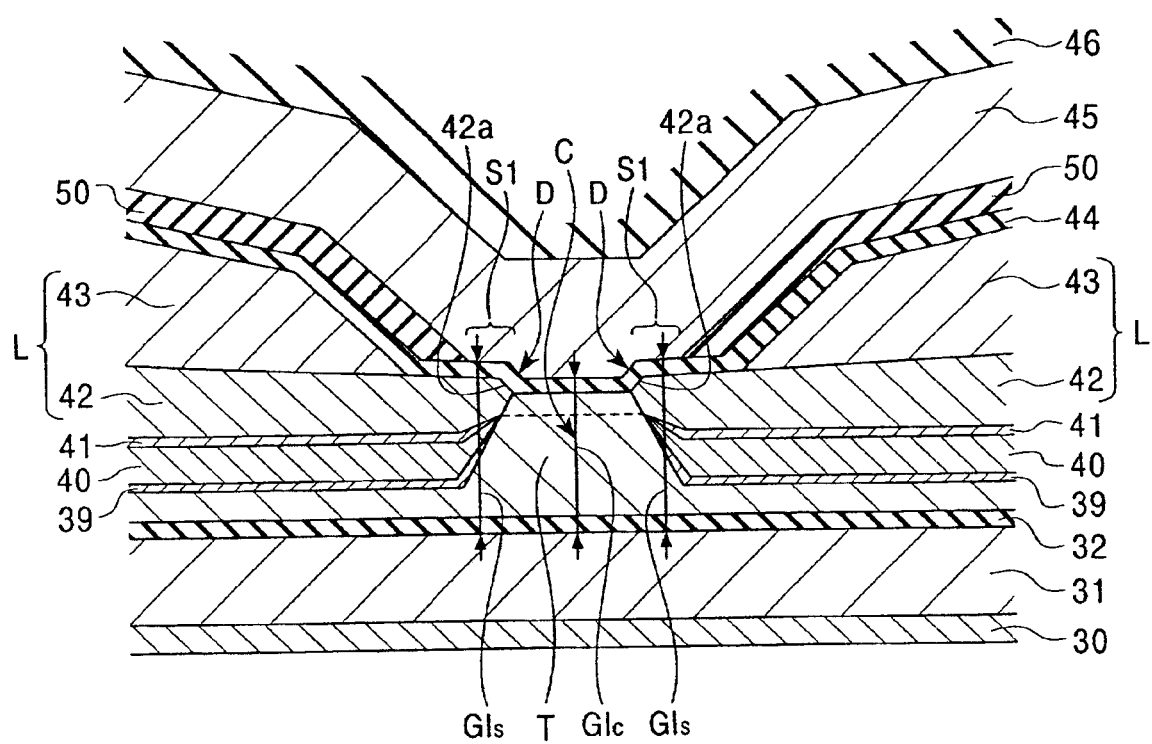
FIG. 21 is a sectional view showing still another step of the embodiment of the method for manufacturing the magnetoresistive sensor of the present invention.

After removing the lift-off resist layer R3 using a resist peeling-off liquid, an upper shield layer 45 is formed on the upper gap layer 44, and a protective barrier layer 46 is formed on the upper shield layer 45, as shown in FIG. 21. The magnetoresistive sensor shown in FIG. 2 is thereby completed.

In the above-described method for manufacturing the magnetoresistive sensor, assuming that the distance G1s is between the upper shield layer 45 and the lower shield layer 31 in areas S1, S1, which overlap only lowermost ones 42, 42 of the first electrode layers 42, 42 and the second electrode layers 43, 43, but do not overlap the insulating layers 50, 50, G1s and the distance G1c is between the upper shield layer 45 and the lower shield layer 31 at a position in alignment with the center C of the multilayered film T is G1c, film thicknesses of the individual layers constituting the magnetoresistive sensor are preferably determined to set a difference in value between G1s and G1c to be not larger than a predetermined value such that an effective track width of the magnetoresistive sensor has a value equal to or below 0.17 μm.

More specifically, values of G1s and G1c are preferably set to satisfy the range of G1c−20 nm≦G1s≦G1c+90 nm. More preferably, values of G1s and G1c are set to satisfy the range of G1c−20 nm≦G1s≦G1c+70 nm. Even more preferably, values of G1s and G1c are set to satisfy the range of G1c−20 nm≦G1s≦G1c+30 nm.

Stated otherwise, values of G1s and G1c are preferably set to satisfy the range of 0.67≦G1s/G1c≦2.50. More preferably, values of G1s and G1c are set to satisfy the range of 0.67≦G1s/G1c≦2.17. Even more preferably, values of G1s and G1c are set to satisfy the range of 0.67≦G1s/G1c≦1.50.

By setting the difference in value between G1s and G1c to be not larger than the predetermined value, it is possible to suppress an increase in the distance between the upper shield layer 45 and the lower shield layer 31 near the multilayered film T on both sides thereof, and hence to reduce the effective track width E-Tw.

Further, in this embodiment of the manufacturing method, the electrode portion L is formed as a thin single layer constituted only by the first electrode layer near the multilayered film T, and the film thickness of the electrode portion L in an area away from the multilayered film T is increased by forming the second electrode layer on the first electrode layer.

Consequently, the direct-current resistance value of the magnetoresistive sensor can be reduced while keeping the distance small between the upper shield layer 45 and the lower shield layer 31 near the multilayered film T on both sides thereof.

Also, since the first electrode layer 42 is formed as a thin layer near the multilayered film T, a step (level difference) D formed by a lateral slope 42a of the first electrode layer 42 relative to the surface of the multilayered film T can be reduced. Therefore, even when the film thickness of the upper gap layer 44 is reduced, the upper gap layer 44 can be adequately formed on the step D. An electrical short-circuit between the upper shield layer 45 and the electrode portion L can thus be prevented with high reliability.

While the method for manufacturing the magnetoresistive sensor shown in FIG. 2 has been described above, the magnetoresistive sensor shown in FIG. 1 can be obtained by omitting the formation of the insulating layers 50, 50. Also, on condition that the values of G1s and G1c satisfy any of the above-mentioned ranges, the magnetoresistive sensor shown in FIG. 3 can be obtained by setting the values of G1s and G1c to satisfy the relationship of G1s=G1c, and the magnetoresistive sensor shown in FIG. 4 can be obtained by setting those values to satisfy the relationship of G1s<G1c.

Further, the magnetoresistive sensor shown in FIG. 5 can be obtained by forming the second electrode layers 43, 43 directly on the intermediate layers 41, 41 without forming the first electrode layers 42, 42.

The magnetoresistive sensor shown in FIG. 8 can be manufactured as follows. The widths of the dead zones d, d of the multilayered film T are measured beforehand using another magnetoresistive sensor based on, e.g., the microtrack profile method. Before forming the first electrode layers 42, 42, the lift-off resist layer is formed such that the resist layer covers only the effective zone and undercuts of the resist layer are positioned to face the dead zones d, d. Then, the first electrode layers 42, 42 are formed so as to enter the undercuts of the resist layer and cover the dead zones.

Figure 22:
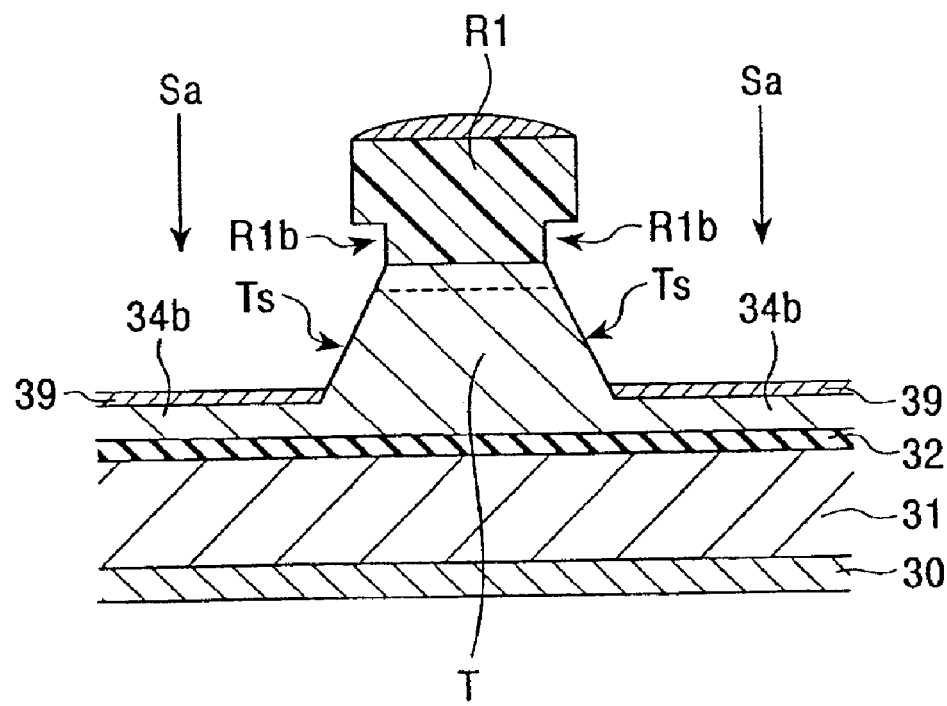
FIG. 22 is a sectional view showing still another step of the embodiment of the method for manufacturing the magnetoresistive sensor of the present invention.

The magnetoresistive sensor shown in FIG. 9 can be obtained by forming the bias underlying layers 39, 39 in the direction normal to the surface of the substrate 30, as shown in FIG. 22. For example, a target for forming the bias underlying layers 39, 39 by sputtering is oriented to face the substrate 30 parallel each other. Then, the bias underlying layers 39, 39 are formed by a sputtering process (such as ion beam sputtering, long-throw sputtering, collimation sputtering, or a combination thereof) in which sputtered particles Sa are emitted at a narrow distribution angle and good straightness. As a result, the sputtered particles are hardly deposited on both lateral surfaces of the multilayered film T, and the bias underlying layers can be formed only on oppositely extended portions 34b of the antiferromagnetic layer 34 of the multilayered film T.

Thereafter, by forming the hard bias layers 40, 40 by isotropic or anisotropic sputtering, lateral surfaces 40a, 40a of the hard bias layers 40, 40 on the sides facing the multilayered film T are in direct contact with the opposite lateral surfaces of the second free magnetic layer 37a, as shown in FIG. 9. With that structure, the hard bias layers 40, 40 and the second free magnetic layer 37a form a magnetically continuous body. As a result, it is possible to prevent demagnetizing fields from being generated at the opposite lateral ends of the second free magnetic layer 37a, and to increase stability.

In other words, by properly setting positions of both lateral ends (undercuts) R1b, R1b of the resist layer R1 and the distribution angle and straightness of the sputtered particles Sa, it is possible to selectively obtain any of the structures wherein the bias underlying layers 39, 39 are not at all formed on the opposite lateral surfaces of the multilayered film T, wherein the bias underlying layers 39, 39 are formed on the opposite lateral surfaces of the multilayered film T to such an extent as not covering the respective opposite lateral surfaces of the second free magnetic layer 37a and the first free magnetic layer 37c, and wherein the bias underlying layers 39, 39 are formed on the opposite lateral surfaces of the multilayered film T such that the bias underlying layers 39, 39 located between the hard bias layers 40, 40 and the second free layer 37a have a film thickness of not larger than 1 nm.

Further, the electrode portion L made up of three or more electrode layers, as shown in FIG. 12, can be obtained by repeating the steps of forming a lift-off resist layer, which is provided with undercuts, to extend from the multilayered film T over an uppermost one of a plurality of electrode layers having been already formed, forming another electrode layer on the uppermost one at a predetermined film-forming angle with respect to the direction normal to the substrate, and then removing the resist layer.

In the steps shown in FIGS. 14 to 17, a resist layer for masking the multilayered film T is formed as the lift-off resist layer R1 having the undercuts R1a, R1a, which is formed by, e.g., the two-layer resist method or the image reversing method.

Figure 23:
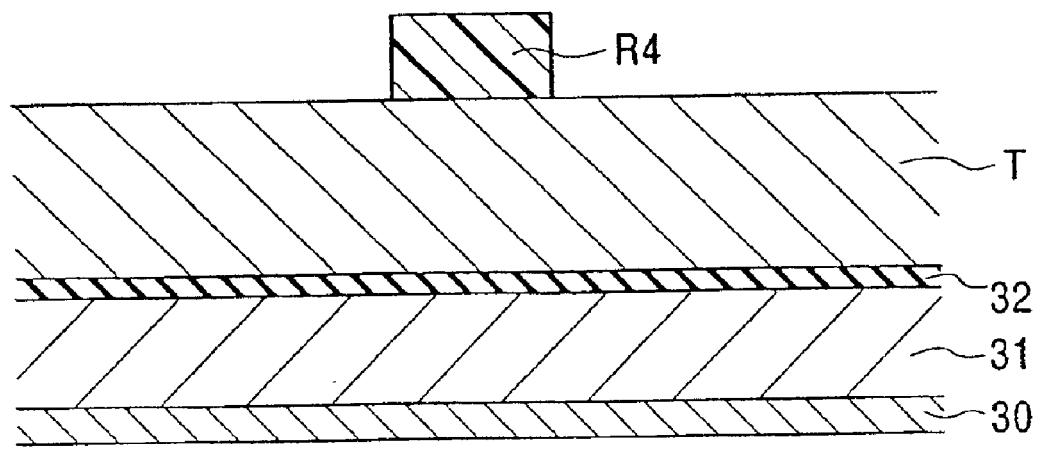
FIG. 23 is a sectional view showing still another step of the embodiment of the method for manufacturing the magnetoresistive sensor of the present invention.

In the present invention, however, a resist layer R4 having no undercuts may be used to mask an area of the magnetoresistive sensor under manufacture corresponding to the optical track width O-Tw, as shown in FIG. 23. When forming the optical track width O-Tw at a size of not larger than 0.2 µm, it is effective to form the resist layer R4 having no undercuts by using, e.g., the electron beam photolithography.

Figure 24:
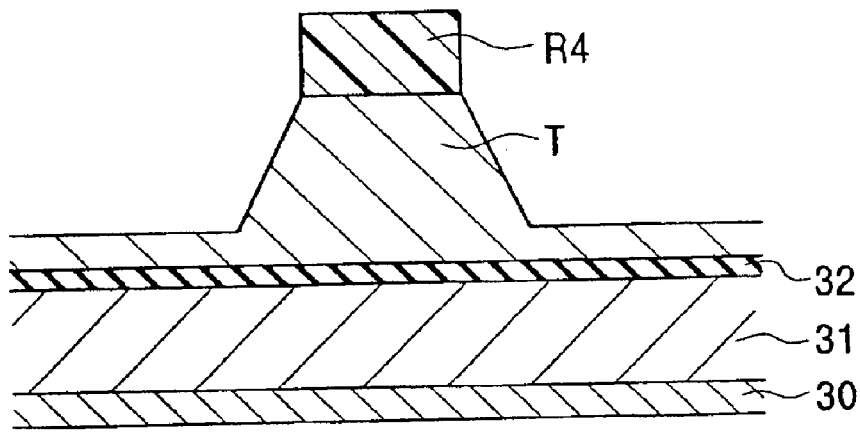
FIG. 24 is a sectional view showing still another step of the embodiment of the method for manufacturing the magnetoresistive sensor of the present invention.

After forming the resist layer R4, areas of the multilayered film T on both sides of the resist layer R4 are etched as shown in FIG. 24.

Figure 25:
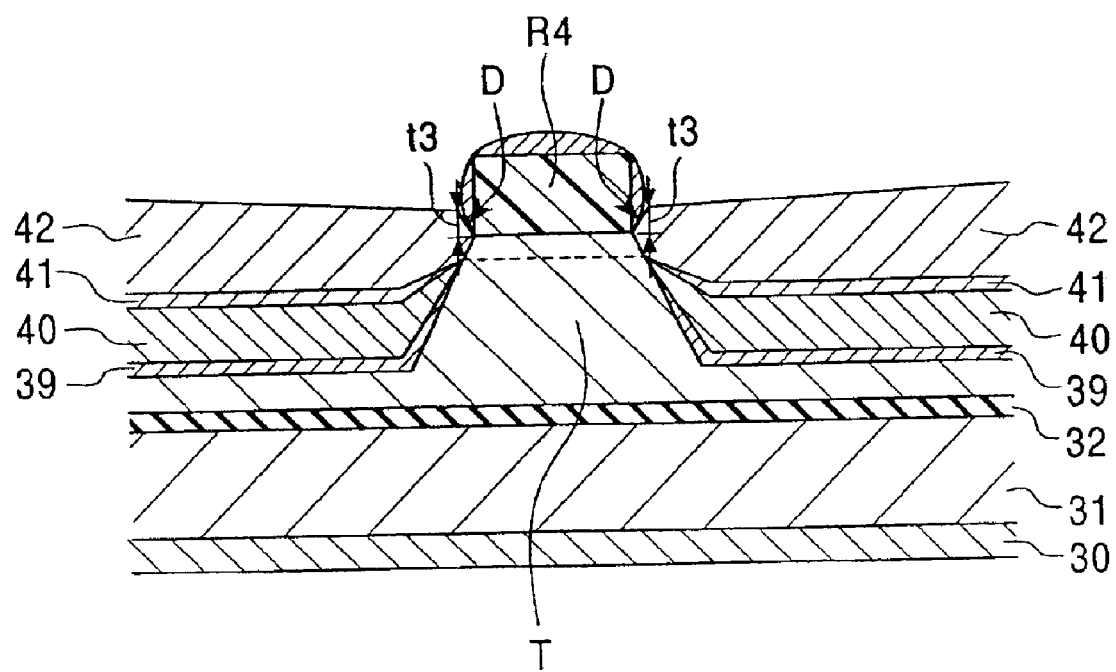
FIG. 25 is a sectional view showing still another step of the embodiment of the method for manufacturing the magnetoresistive sensor of the present invention.

Then, in a step shown in FIG. 25, the bias underlying layers 39, 39, the hard bias layers 40, 40, the intermediate layers 41, 41, and the first electrode layers 42, 42 are successively formed on both sides of the multilayered film T remained after the etching.

In the present invention, the first electrode layers 42, 42 can be each formed as a thin layer near the multilayered film T, and a step (level difference) D formed by the lateral slope of the first electrode layer 42 relative to the surface of the multilayered film T can be reduced to a small height t3. Accordingly, even in the case of using the resist layer R4 having no undercuts, the resist layer R4 can be satisfactorily removed after forming the first electrode layers 42, 42.

Additionally, a composite magnetic head for recording and reproduction may be manufactured by forming an inductive head for recording may be formed on the magnetoresistive sensor of the present invention.

EXAMPLE

A floating type magnetic head was fabricated using the magnetoresistive sensor having the structure shown in FIG. 1. The effective track or read width E-Tw of the magnetic head was measured by varying the distance G1s between the upper shield layer 45 and the lower shield layer 31 in the areas S, S, which overlap only the first electrode layers 42, 42, but do not overlap the second electrode layers 43, 43, while the distance G1c between the upper shield layer 45 and the lower shield layer 31 at a position in alignment with the center C of the multilayered film T of the magnetoresistive sensor was kept fixed.

Figure 27:
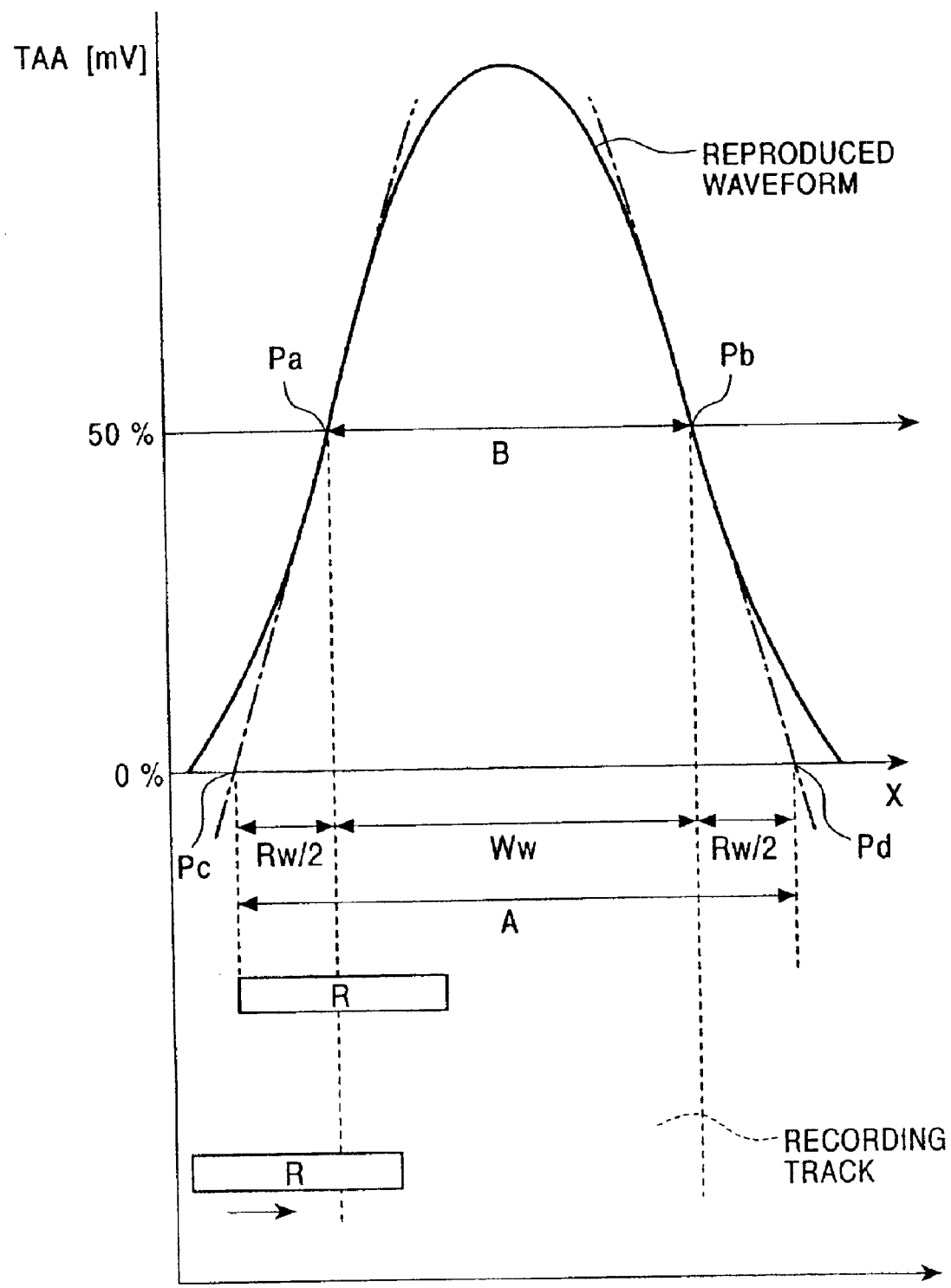
FIG. 27 is a graph for explaining the full-track profile method.

The effective track width E-Tw was measured by the full-track profile method described above (see FIG. 27).

In the magnetoresistive sensor used for the measurement, G1c was 60 nm, the optical track width O-Tw was 0.15 µm, the length Z2 of the multilayered film T in the height direction was 0.1 µm, and the amount of magnetic floating of the head from a recording medium was 18 nm. Also, the measurement was made for two cases in which a value of residual magnetization (remanence)×film thickness of the hard bias layers 40, 40 was set to 7.5 T·nm and 21.7 T·nm.

Figure 26:
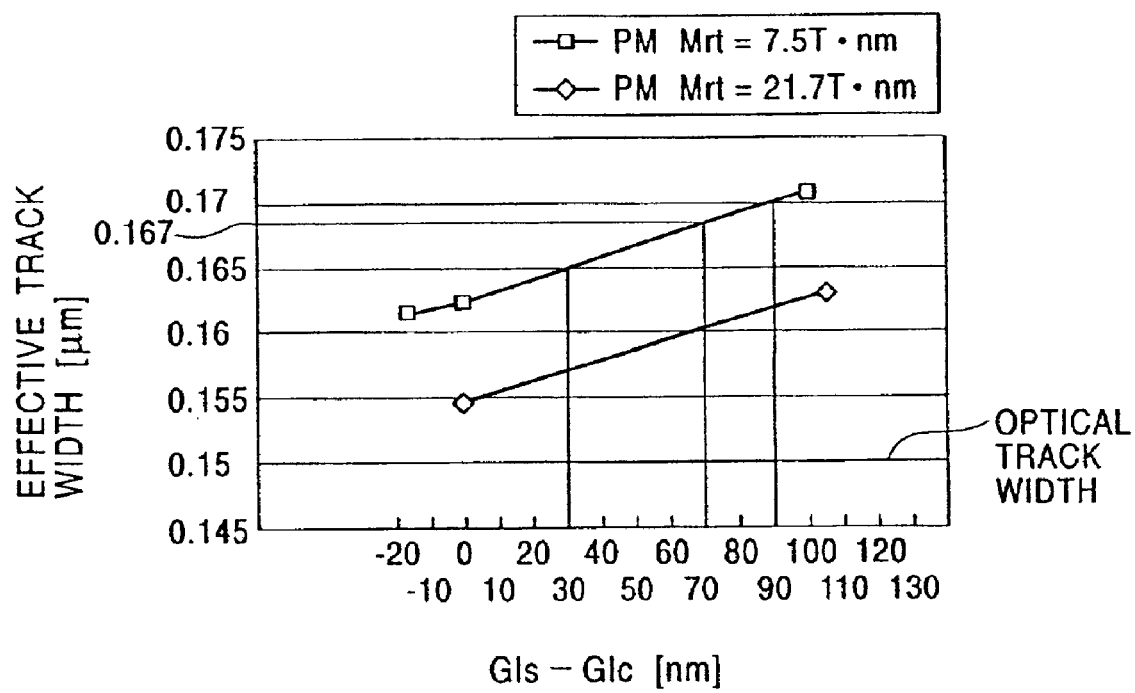
FIG. 26 is a graph showing the relationship between a difference value of G1s–G1c and an effective track width.

FIG. 26 is a graph showing the relationship between the difference value of G1s–G1c and the effective track width E-Tw.

As seen from the graph of FIG. 26, the effective track width E-Tw is reduced as the value of G1s reduces.

More specifically, it is seen that, when the value of residual magnetization×film thickness of the hard bias layers 40, 40 was set to 7.5 T·nm, the difference in value between G1s and G1c is required to be not larger than 90 nm in order to obtain the effective track width E-Tw of 0.17 µm or below. Further, by setting the difference value between G1s and G1c to be not larger than 70 nm, the effective track width E-Tw can be made 0.167 µm or below. By setting the difference value between G1s and G1c to be not larger than 30 nm, the effective track width E-Tw can be made 0.165 µm or below.

Also, when the value of residual magnetization×film thickness of the hard bias layers 40, 40 was set to 21.7 T·nm, the effective track width E-Tw can be made 0.16 µm or below by setting the difference in value between G1s and G1c to be not larger than 70 nm. Further, by setting the difference in value between G1s and G1c to be not larger than 30 nm, the effective track width E-Tw can be made 0.157 µm or below.

From the standpoint of forming the hard bias layers 40, 40 in sufficient thickness, it is preferable to satisfy the relationship of G1s–G1c≧–20 nm.

From the above results, the following conclusion is derived in the present invention. Values of G1s and G1c are preferably set to satisfy the range of G1c–20 nm≦G1s≦G1c+90 nm. More preferably, values of G1s and G1c are set to satisfy the range of G1c–20 nm≦G1s≦G1c+70 nm. Even more preferably, values of G1s and G1c are set to satisfy the range of G1c–20 nm≦G1s≦G1c+30 nm.

Stated otherwise, on condition that G1c is 60 nm and the preferable ranges are defined for G1s and G1c as mentioned above, values of G1s and G1c are preferably set to satisfy the range of 0.67≦G1s/G1c≦2.50. More preferably, values of G1s and G1c are set to satisfy the range of 0.67≦G1s/G1c≦2.17. Even more preferably, values of G1s and G1c are set to satisfy the range of 0.67≦G1s/G1c≦1.50.

According to the present invention, as described above, by setting the difference in value between G1s and G1c to be not larger than the predetermined value, it is possible to reduce the distance between the upper shield layer and the lower shield layer near the multilayered film on both sides thereof, and hence to reduce the effective track width.

Also, in the present invention, an electrode portion is of a multilayered structure of electrode layers formed as plural pairs of electrodes such that each pair of electrodes are spaced from each other by a predetermined spacing in the track-width direction, and the spacing between each pair of electrodes in the track-width direction is larger in the electrode layer located a higher level. With that structure, the electrode portion is formed as a thin single layer by a lowermost electrode layer near the multilayered film, and the film thickness of the electrode portion in an area away from the multilayered film is increased by forming one or more higher-level electrode layers on the lowermost electrode layer.

Consequently, an increase in direct-current resistance value of the magnetoresistive sensor can be suppressed while keeping small the distance between the upper shield layer and the lower shield layer near the multilayered film on both sides thereof.

Furthermore, in the present invention, since the electrode portion is formed as a thin layer near the multilayered film, a step (level difference) formed by a lateral slope of the electrode portion relative to the surface of the multilayered film can be reduced. Therefore, even when the film thickness of the upper gap layer is reduced, the upper gap layer can be adequately formed on the step. An electrical short-circuit between the upper shield layer and the electrode portion can thus be prevented with high reliability.

What is claimed is:

1. A magnetoresistive sensor including, on a substrate, a lower shield layer made of a magnetic material; a lower gap layer made of an insulating material and formed on said lower shield layer; a multilayered film comprising an antiferromagnetic layer, a pinned magnetic layer having a magnetized direction pinned by an exchange coupling magnetic field produced upon interaction with said antiferromagnetic layer, a nonmagnetic material layer, and a free magnetic layer of which magnetization is varied depending on an external magnetic field, said multilayered film being formed on said lower gap layer; an electrode portion for supplying an electric current to said multilayered film; an upper gap layer made of an insulating material and formed on said multilayered film and said electrode portion; and an upper shield layer made of a magnetic material and formed on said upper gap layer, said electrode portion comprising a plurality of electrode layers successively formed as plural pairs of electrodes in an area overlapping said multilayered film in a track width direction or areas on both sides of said multilayered film such that each pair of electrodes are spaced apart from each other by a predetermined spacing in the track-width direction and the spacing between each pair of electrodes in the track-width direction, is larger in the electrode layer located at a higher level, wherein a distance between said upper shield layer and said lower shield layer in an area, which overlaps only a lowermost one of said plurality of electrode layers, is G1$s$, and a distance between said upper shield layer and said lower shield layer at a position in alignment with a center of said multilayered film is G1$c$, a difference in value between G1$s$ and G1$c$ is set to be not larger than a predetermined value such that an effective track width of the magnetoresistive sensor has a value equal to 0.17 μm or below.

2. A magnetoresistive sensor according to claim 1, wherein values of G1$s$ and G1$c$ are set to satisfy a range of G1$c$−20 nm≦G1$s$≦G1$c$+90 nm.

3. A magnetoresistive sensor according to claim 1, wherein values of G1$s$ and G1$c$ are set to satisfy a range of G1$c$−20 nm≦G1$s$≦G1$c$+30nm.

4. A magnetoresistive sensor according to claim 1, wherein values of G1$s$ and G1$c$ are set to satisfy a relationship of G1$s$22 G1$c$.

5. A magnetoresistive sensor according to claim 1, wherein said plurality of electrode layers are formed such that an angle formed between a plane parallel to a surface of said multilayered film and a plane tangential to a front edge of each electrode layer is smaller in the electrode layer located at a higher level.

6. A magnetoresistive sensor according to claim 1, wherein said plurality of electrode layers are formed such that an electrode layer located at a higher level has a larger film thickness.

7. A magnetoresistive sensor according to claim 1, wherein a lowermost one of said plurality of electrode layers has a length in a height direction larger than a length of said multilayered film in the height direction.

8. A magnetoresistive sensor according to claim 1, wherein a lowermost one of said plurality of electrode layers is formed of one or more elements selected from a group consisting of W, Ta, Rh, Ir and Ru, and any electrode layer other than the lowermost one is formed of one or more elements selected from a group consisting of Cr, Cu, Au and Ta.

9. A magnetoresistive sensor including, on a substrate, a lower shield layer made of a magnetic material;

a lower gap layer made of an insulating material and formed on said lower shield layer;

a multilayered film comprising an antiferromagnetic layer, a pinned magnetic layer having a magnetized direction pinned by an exchange coupling magnetic field produced upon interaction with said antiferromagnetic layer, a nonmagnetic material layer, and a free magnetic layer of which magnetization is varied depending on an external magnetic field, said multilayered film being formed on said lower gap layer; a hard bias layer for aligning a magnetized direction of said free magnetic layer in a certain direction; an electrode portion formed at a position overlying said hard bias layer in a track width direction and supplying an electric current to said multilayered film; an upper gap layer made of an insulating material and formed on said multilayered film and said electrode portion; and an upper shield layer made of a magnetic material and formed on said upper gap layer, said electrode portion comprising a plurality of electrode layers successively formed as plural pairs of electrodes in an area overlapping said multilayered film in the track width direction or areas on both sides of said multilayered film such that each pair of electrodes are spaced apart from each other by a predetermined spacing in the track-width direction, and the spacing between each pair of electrodes in the track-width direction is larger in the electrode layer located at a higher level.

10. A magnetoresistive sensor according to claim 9, wherein said plurality of electrode layers are formed such that an angle formed between a plane parallel to a surface of said multilayered film and a plane tangential to a front edge of each electrode layer is smaller in the electrode layer located at a higher level.

11. A magnetoresistive sensor according to claim 9, wherein said plurality of electrode layers are formed such that an electrode layer located at a higher level has a larger film thickness.

12. A magnetoresistive sensor according to claim 9, wherein a lowermost one of said plurality of electrode layers has a length in a height direction larger than a length of said multilayered film in the height direction.

13. A magnetoresistive sensor according to claim 9, wherein a lowermost one of said plurality of electrode layers is formed of one or more elements selected from a group consisting of W, Ta, Rh, Ir and Ru, and any electrode layer other than the lowermost one is formed of one or more elements selected from a group consisting of Cr, Cu, Au and Ta.

* * * * *

UNITED STATES PATENT AND TRADEMARK OFFICE
CERTIFICATE OF CORRECTION

PATENT NO. : 6,844,998 B2
DATED : January 18, 2005
INVENTOR(S) : Daigo Aoki et al.

It is certified that error appears in the above-identified patent and that said Letters Patent is hereby corrected as shown below:

Column 37,
Line 38, delete "G1s22 G1c." and substitute -- G1s > G1c. -- in its place.

Signed and Sealed this

Twenty-fourth Day of May, 2005

JON W. DUDAS
*Director of the United States Patent and Trademark Office*